(12) United States Patent
Weidman et al.

(10) Patent No.: US 9,716,205 B2
(45) Date of Patent: Jul. 25, 2017

(54) SOLAR CELL EMITTER REGION FABRICATION USING ION IMPLANTATION

(71) Applicants: Timothy Weidman, Sunnyvale, CA (US); David D. Smith, Campbell, CA (US)

(72) Inventors: Timothy Weidman, Sunnyvale, CA (US); David D. Smith, Campbell, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 15/197,616

(22) Filed: Jun. 29, 2016

(65) Prior Publication Data

US 2016/0315214 A1    Oct. 27, 2016

Related U.S. Application Data

(63) Continuation of application No. 14/562,159, filed on Dec. 5, 2014, now Pat. No. 9,401,450.
(Continued)

(51) Int. Cl.
*H01L 31/18* (2006.01)
*H01L 31/0224* (2006.01)
(Continued)

(52) U.S. Cl.
CPC .... *H01L 31/182* (2013.01); *H01L 31/022441* (2013.01); *H01L 31/035272* (2013.01);
(Continued)

(58) Field of Classification Search
None
See application file for complete search history.

(56) References Cited

U.S. PATENT DOCUMENTS 2,695,852 A   11/1954  Sparks
3,736,425 A    5/1973  Chernow
(Continued)

FOREIGN PATENT DOCUMENTS

KR    20110020062     3/2011
WO    WO-2011/109058  9/2011

OTHER PUBLICATIONS

Lu, Nicky C., et al., "Modeling and Optimization of Monolithic Polycrystalline Silicon Resistors", IEEE Transactions on Electron Devices, vol. ED-28, No. 7, Jul. 1981, pp. 818-830.
(Continued)

*Primary Examiner* — Jack Chen
(74) *Attorney, Agent, or Firm* — Blakely Sokoloff Taylor Zafman LLP

(57) ABSTRACT

Methods of fabricating solar cell emitter regions using ion implantation, and resulting solar cells, are described. In an example, a method of fabricating alternating N-type and P-type emitter regions of a solar cell involves forming a silicon layer above a substrate. Dopant impurity atoms of a first conductivity type are implanted, through a first shadow mask, in the silicon layer to form first implanted regions and resulting in non-implanted regions of the silicon layer. Dopant impurity atoms of a second, opposite, conductivity type are implanted, through a second shadow mask, in portions of the non-implanted regions of the silicon layer to form second implanted regions and resulting in remaining non-implanted regions of the silicon layer. The remaining non-implanted regions of the silicon layer are removed with a selective etch process, while the first and second implanted regions of the silicon layer are annealed to form doped polycrystalline silicon emitter regions.

11 Claims, 14 Drawing Sheets

Related U.S. Application Data

(60) Provisional application No. 61/913,614, filed on Dec. 9, 2013.

(51) Int. Cl.
*H01L 31/068* (2012.01)
*H01L 31/0352* (2006.01)

(52) U.S. Cl.
CPC ...... *H01L 31/0682* (2013.01); *H01L 31/1864* (2013.01); *H01L 31/1872* (2013.01); *H01L 31/1876* (2013.01); *Y02E 10/546* (2013.01); *Y02E 10/547* (2013.01); *Y02P 70/521* (2015.11)

(56) References Cited

U.S. PATENT DOCUMENTS

| | | | |
|---|---|---|---|
| 3,790,412 | A | 2/1974 | Moline |
| 4,086,102 | A | 4/1978 | King |
| 4,381,956 | A | 5/1983 | Lane |
| 4,448,797 | A | 5/1984 | Burnham |
| 4,448,865 | A | 5/1984 | Bohlen et al. |
| 4,557,037 | A | 12/1985 | Hanoka et al. |
| 5,907,766 | A | 5/1999 | Swanson et al. |
| 6,087,274 | A | 7/2000 | Tonucci et al. |
| 6,335,534 | B1 | 1/2002 | Suguro et al. |
| 6,417,078 | B1 | 7/2002 | Dolan et al. |
| 6,614,033 | B2 | 9/2003 | Suguro et al. |
| 7,094,612 | B2 | 8/2006 | Shibata et al. |
| 7,179,569 | B2 | 2/2007 | Suguro et al. |
| 7,208,381 | B2 | 4/2007 | Lee |
| 7,459,246 | B2 | 12/2008 | Suguro et al. |
| 7,531,216 | B2 | 5/2009 | Brody |
| 7,638,438 | B2 | 12/2009 | Eldershaw |
| 7,727,866 | B2 | 6/2010 | Bateman et al. |
| 7,745,073 | B2 | 6/2010 | Suguro et al. |
| 7,816,239 | B2 | 10/2010 | Blake et al. |
| 7,820,460 | B2 | 10/2010 | Sullivan et al. |
| 7,888,249 | B2 | 2/2011 | Bateman et al. |
| 8,222,053 | B2 | 7/2012 | Sullivan et al. |
| 8,440,571 | B2 | 5/2013 | Weidman et al. |
| 8,470,616 | B2 | 6/2013 | Sullivan et al. |
| 9,263,625 | B2 | 2/2016 | Smith et al. |
| 9,401,450 | B2 * | 7/2016 | Weidman ............ H01L 31/182 |
| 2004/0112426 | A1 | 6/2004 | Hagino |
| 2008/0072953 | A1 | 3/2008 | Stephens et al. |
| 2009/0068783 | A1 | 3/2009 | Borden |
| 2009/0227061 | A1 | 9/2009 | Bateman et al. |
| 2009/0263928 | A1 | 10/2009 | Tseng |
| 2011/0059571 | A1 | 3/2011 | De Ceuster et al. |
| 2011/0104618 | A1 | 5/2011 | Bateman et al. |
| 2011/0237022 | A1 | 9/2011 | Bateman et al. |
| 2012/0122302 | A1 | 5/2012 | Weidman et al. |
| 2012/0266951 | A1 | 10/2012 | Li et al. |
| 2013/0065404 | A1 | 3/2013 | Weidman et al. |
| 2013/0071580 | A1 | 3/2013 | Weidman et al. |
| 2014/0154834 | A1 | 6/2014 | Bateman et al. |
| 2016/0315214 | A1 * | 10/2016 | Weidman ............ H01L 31/182 |

OTHER PUBLICATIONS

Meier, D. L., et al., "Aluminum alloy back p-n junction dendritic web silicon solar cell", Elsevier, Solar Energy Materials & Solar Cells 65 (2001), pp. 621-627.

Nishihashi, T., et al., "Ion-graphy implanter with stencil mask", Journal of Vacuum Science & Technology B20, 914 (2002); doi: 10.1116/1.1475982, 5 pgs.

Rusop, M., et al., "Photoelectrical properties of pulsed laser deposited boron doped p-carbon/n-silicon and phosphorus doped n-carbon/p-silicon heterojunction solar cells", Elsevier, Solar Energy 78 (2005) pp. 406-415.

Tonari, Kazuhiko, et al., "Stencil mask Ion Implantation Technology for realistic approach to wafer process", AIP Conference Proceedings 866, 401 (2006); doi; 10.1063/1.2401541, 5 pgs.

Wang, Qi, et al., "Combinatorial synthesis of solid state electronic materials for renewable energy applications", Elsevier, Applied Surface Science 189 (2002), pp. 271-276.

FAI Pre-Interview Communication from U.S. Appl. No. 14/562,159 mailed Nov. 10, 2015, 8 pgs.

International Preliminary Report on Patentability from PCT/US2014/069169 mailed Jun. 23, 2016, 8 pgs.

Supplementary European Search Report from European Patent Application No. 14869894.7-1504 mailed Aug. 10, 2016, 7 pgs.

International Search Report and Written Opinion for PCT Patent Application No. PCT/US2014/069169, mailed Mar. 27, 2015, 10 pgs.

A. Soderbarg, "Fabrication of BESOI-Materials Using Implanted Nitrogen as an Effective Etch Stop Barrier," Uppsala University, SOS/SOI Technology Conference, Stateline, Nevada, Oct. 3-5, 1989, 2 pages.

Lehmann, V. et al., "Implanted Carbon: An Effective Etch-Stop in Silicon," J. Eiectrochem. Soc., vol. 138, No. 5, May 1991, 2 pages.

* cited by examiner

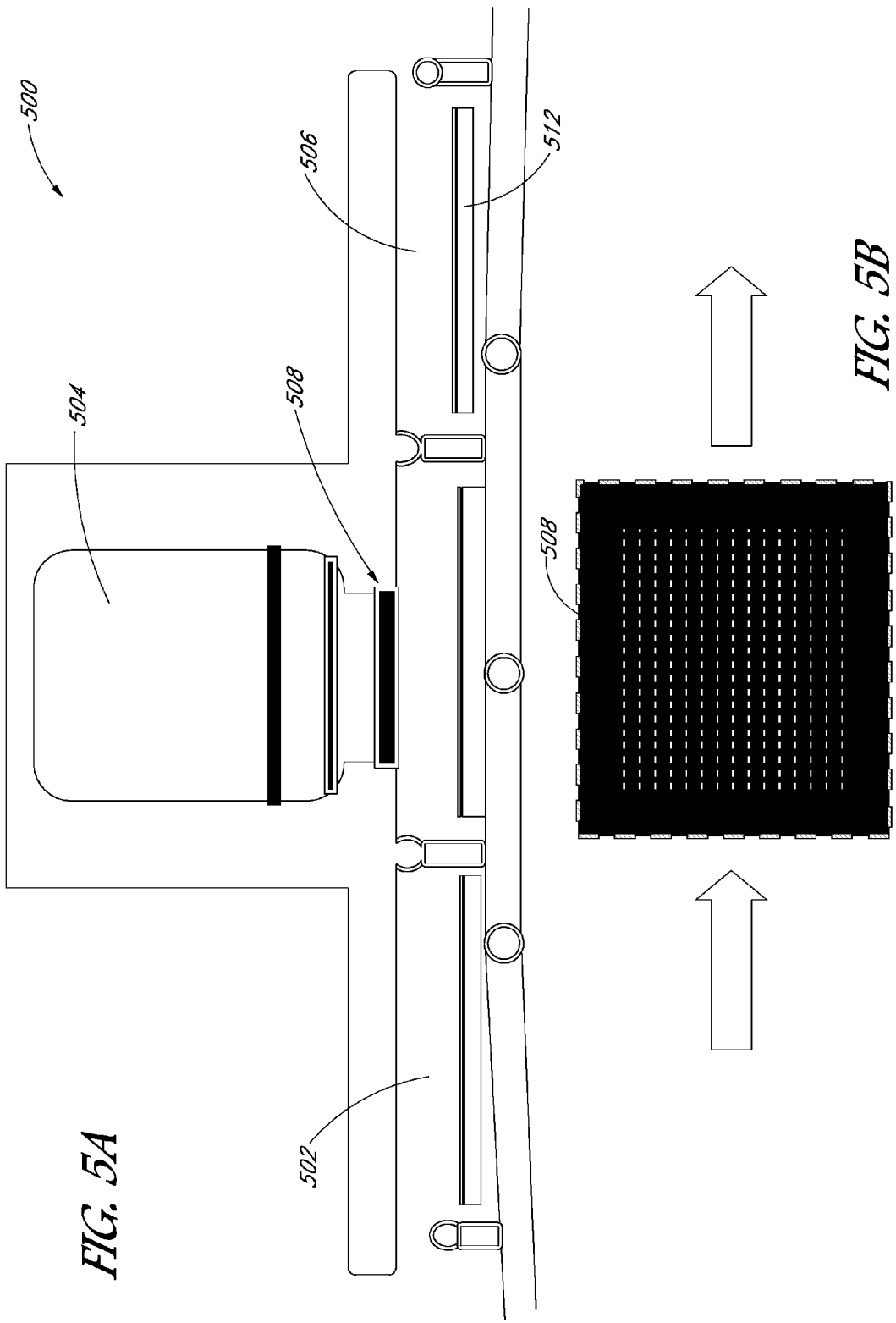

SOLAR CELL EMITTER REGION FABRICATION USING ION IMPLANTATION

CROSS-REFERENCE TO RELATED APPLICATIONS

This application is a continuation of U.S. patent application Ser. No. 14/562,159, filed on Dec. 5, 2014, which claims the benefit of U.S. Provisional Application No. 61/913,614, filed on Dec. 9, 2013, the entire contents of which are hereby incorporated by reference herein.

TECHNICAL FIELD

Embodiments of the present disclosure are in the field of renewable energy and, in particular, methods of fabricating solar cell emitter regions using ion implantation, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIG. 5A schematically illustrates a cross-sectional view of an inline platform for patterned implant involving a traveling wafer and stationary shadow mask, in accordance with an embodiment of the present disclosure.

FIG. 5B illustrates an implant sequence through a graphite proximity mask in the apparatus of FIG. 5A, in accordance with an embodiment of the present disclosure.

DETAILED DESCRIPTION

Figure 1A:
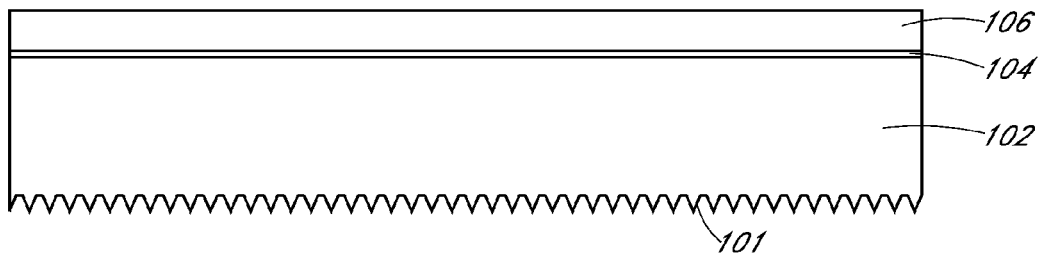
FIGS. 1A-1E illustrate cross-sectional views of various stages in the fabrication of a solar cell, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Methods of fabricating solar cell emitter regions using ion implantation, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating alternating N-type and P-type emitter regions of a solar cell involves forming a silicon layer above a substrate. Dopant impurity atoms of a first conductivity type are implanted, through a first shadow mask, in the silicon layer to form first implanted regions and resulting in non-implanted regions of the silicon layer. Dopant impurity atoms of a second, opposite, conductivity type are implanted, through a second shadow mask, in portions of the non-implanted regions of the silicon layer to form second implanted regions and resulting in remaining non-implanted regions of the silicon layer. The remaining non-implanted regions of the silicon layer are removed with a selective etch process preserving the first implanted regions and the second implanted regions of the silicon layer. The first implanted regions and the second implanted regions of the silicon layer are annealed to form doped polycrystalline silicon emitter regions.

In another embodiment, a method of fabricating an emitter region of a solar cell involves forming a silicon layer above a substrate. A carbosilane layer is formed on the silicon layer. Dopant impurity atoms are implanted, through a shadow mask, in the carbosilane layer and the silicon layer to form implanted silicon regions and corresponding self-aligned implanted regions of the carbosilane layer, and resulting in non-implanted regions of the silicon layer and corresponding non-implanted regions of the carbosilane layer. The non-implanted regions of the silicon layer and the non-implanted regions of the carbosilane layer are removed. The implanted regions of the carbosilane layer protect the implanted regions of the silicon layer during the removing. The implanted regions of the silicon layer are annealed to form doped polycrystalline silicon emitter regions.

Also disclosed herein are solar cells. In one embodiment, a back contact solar cell includes a monocrystalline silicon substrate having a light-receiving surface and a back surface. A thin dielectric layer is disposed on the back surface of the monocrystalline silicon substrate. A polycrystalline silicon emitter region is disposed on the thin dielectric layer. The polycrystalline silicon emitter region is doped with impurity atoms. A carbosilane layer is disposed on, and aligned with, the polycrystalline silicon emitter region. A conductive contact structure is disposed through the carbosilane layer and on the polycrystalline silicon emitter region.

One or more embodiments described herein provides a simplified process flow for fabricating high efficiency, all back-contact solar cell devices involving the use of ion implant technology for generating one or both of N+ (e.g., typically phosphorus or arsenic doped) and P+ (e.g., typically boron doped) polysilicon emitter layers. In one embodiment, a fabrication approach involves the use of ion implantation to not only introduce atoms of the required dopant type into an emitter layer but also to induce sufficient changes in the wet etch properties of a thin surface layer thereon so as to permit its use as a mask during selective wet etch removal of all non-implanted regions of the emitter layer.

To provide context, the introduction of new high throughput ion implant tools targeting high efficiency solar applications with patterning capabilities may be applicable to the fabrication of interdigitated back contact (IBC) solar cells. In particular, in cases where physical and chemical changes are associated with performing ion implant operations, such implantation can be exploited to permit the formation of a self-aligned trench pattern. As described in greater detail below, one or more approaches to accomplish self-aligned trench patterning are based on the relatively high reactivity of Si—H bonds during the implant process, in particular employing wet etch chemistries most effective for removing materials having unreacted (i.e., remaining) Si—H bonds.

Some embodiments are directed to approaches for generating a high efficiency, all back contact solar cell structure employing proven N+ and P+ polysilicon emitter/tunnel oxide structures fabricated by performing patterned ion implant under conditions that promote loss of H, densification, and partial crystallization of an amorphous Si layer, and/or a thin carbosilane capping layer over an intrinsic amorphous hydrogenated silicon (a-Si:H) layer or undoped polysilicon layer. The implant plant process can be followed by a selective wet etch operation that removes all non-implanted (e.g., non-densified and remaining Si—H rich areas) employing an alkaline etch process with subsequent hydrofluoric acid/ozone (HF/Os) clean. In one such embodiment, an approach involves the use of wafers already textured on a front surface, such that after the wet etch removal of the non-implanted trench, a single high temperature anneal step is adequate to activate the dopants and achieve a light blanket phosphorus diffusion and oxidation operation. In another embodiment, the effective etch selectivity between ion implanted and non-ion-implanted areas is enhanced by adding a thin carbosilane based layer on the surface of the a-Si:H layer. The above and other approaches are described in greater detail below.

In a first exemplary process flow using implant induced etch selectivity for self-aligned trench formation, FIGS. 1A-1E illustrate cross-sectional views of various stages in the fabrication of a solar cell, in accordance with an embodiment of the present disclosure. FIG. 2 is a flowchart 200 listing operations in a method of fabricating a solar cell as corresponding to FIGS. 1A-1E, in accordance with an embodiment of the present disclosure.

Figure 2:
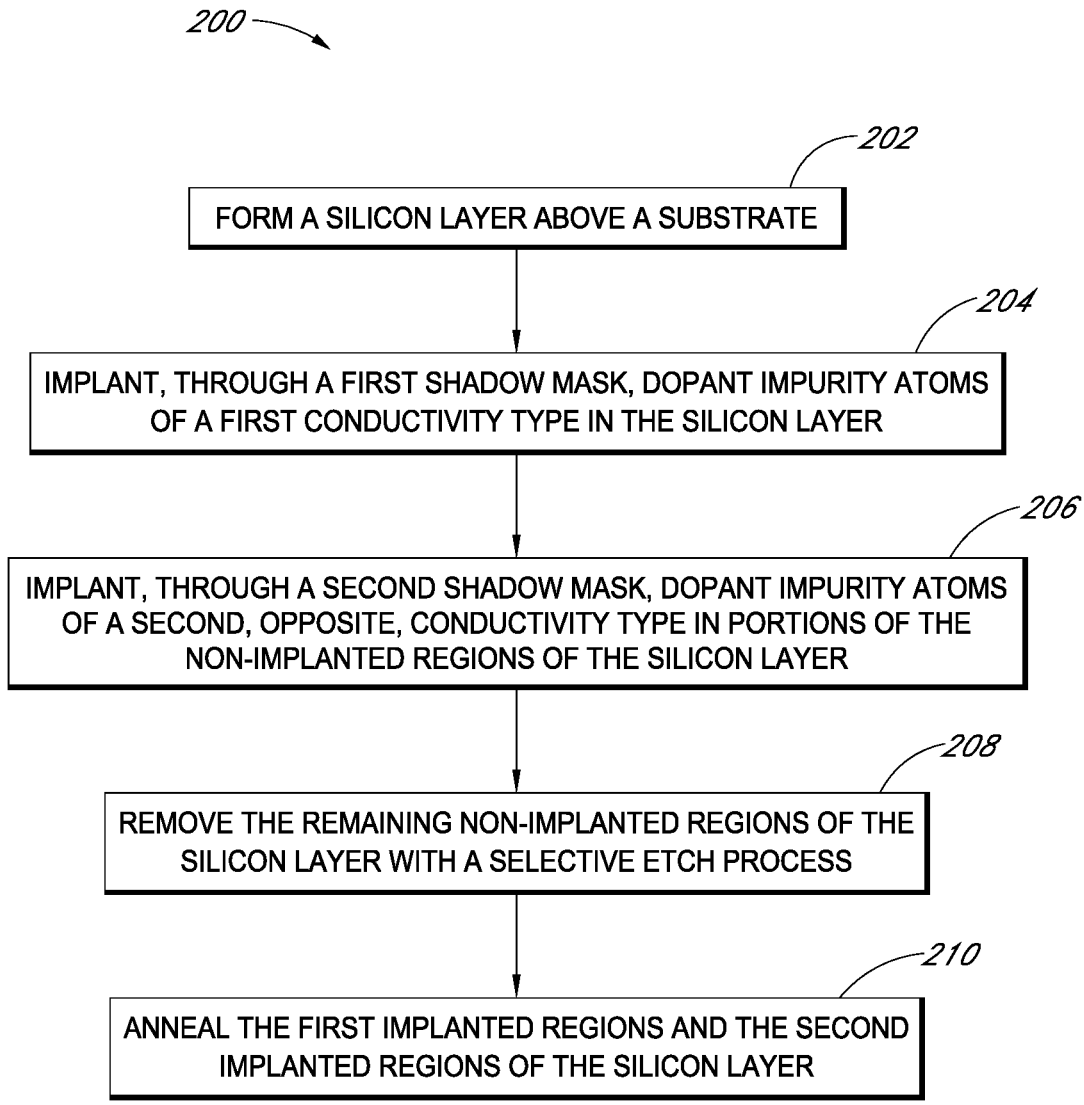
FIG. 2 is a flowchart listing operations in a method of fabricating a solar cell as corresponding to FIGS. 1A-1E, in accordance with an embodiment of the present disclosure.

Referring to FIG. 1A and corresponding operation 202 of flowchart 200, a method of fabricating alternating N-type and P-type emitter regions of a solar cell involves forming an amorphous silicon layer 106 on a thin dielectric layer 104 disposed on a substrate 102.

In an embodiment, the substrate 102 is a monocrystalline silicon substrate, such as a bulk single crystalline N-type doped silicon substrate. It is to be understood, however, that substrate 102 may be a layer, such as a multi-crystalline silicon layer, disposed on a global solar cell substrate. In an embodiment, the thin dielectric layer is a tunnel dielectric silicon oxide layer having a thickness of approximately 2 nanometers or less. In one embodiment, the amorphous silicon layer 106 is a hydrogenated silicon layer formed using plasma enhanced chemical vapor deposition (PECVD), represented by a-Si:H, which includes S—H covalent bonds throughout the layer. However, in an alternative embodiment, a polycrystalline silicon layer is used instead of amorphous silicon. Referring again to FIG. 1A, in an embodiment, a light receiving surface 101 of the substrate 102 is texturized, as shown and as described in greater detail below.

Figure 1B:
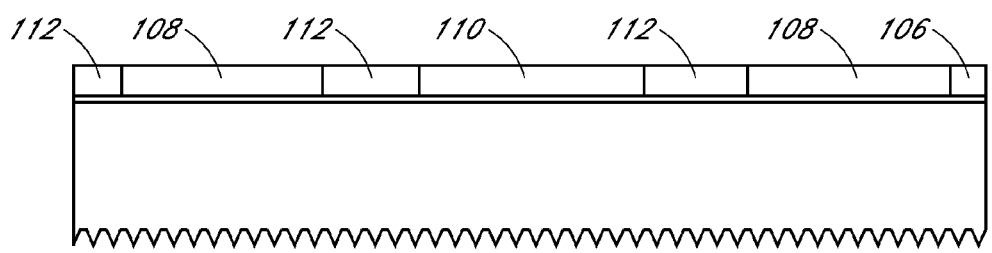

Referring to FIG. 1B and corresponding operation 204 of flowchart 200, dopant impurity atoms of a first conductivity type are implanted in the amorphous silicon layer 106 to form first implanted regions 108 and resulting in non-implanted regions 112 of the silicon layer (i.e., remaining portions of amorphous silicon layer 106 that have not been implanted at this stage in the process). In one such embodiment, the implanting is performed through a first shadow mask, examples of which are described in association with FIGS. 5B and 6B. In a specific such embodiment, the first shadow mask is a graphite shadow mask positioned off of, but in close proximity to, the amorphous silicon layer 106.

In an embodiment, the implanting is performed by using ion beam implantation or plasma immersion implantation. In one embodiment, this first implanting provides P+ dopant atoms for silicon (e.g., boron atoms). In another embodiment, however, the first implanting provides N+ dopant atoms for silicon (e.g., phosphorus atoms or arsenic atoms). In an embodiment, the conditions used to perform the implantation are tuned (e.g., by sequential or simultaneous electron bombardment) to enhance subsequent etch selectivity between implanted and non-implanted regions, as pertaining to later operations described below. Other conditions that may be tuned can include one or more of substrate biasing during implantation, temperature tuning, and dose tuning.

Referring again to FIG. 1B and now to corresponding operation 206 of flowchart 200, dopant impurity atoms of a second conductivity type are implanted in the amorphous silicon layer 106 to form second implanted regions 110 and resulting in non-implanted regions 112 of the silicon layer (i.e., remaining portions of amorphous silicon layer 106 that were not been implanted in either of the above described implantation processes). In one such embodiment, the implanting is performed through a second shadow mask, examples of which are described in association with FIGS. 5B and 6B. As in the case of the first shadow mask, in a specific such embodiment, the second shadow mask is a graphite shadow mask positioned off of, but in close proximity to, the amorphous silicon layer 106. It is to be appreciated that, depending on layout requirements, the first mask may be shifted and used in place of a second, separate mask.

As in the case for the first implantation process, in an embodiment, the implanting is performed by using ion beam implantation or plasma immersion implantation. In one embodiment, this second implanting provides N+ dopant atoms for silicon (e.g., phosphorus atoms or arsenic atoms). In another embodiment, however, the second implanting provides P+ dopant atoms for silicon (e.g., boron atoms). In an embodiment, the conditions used to perform the implantation are tuned (e.g., by sequential or simultaneous electron bombardment) to enhance subsequent etch selectivity between implanted and non-implanted regions, as pertaining to later operations described below. Other conditions that may be tuned can include one or more of substrate biasing during implantation, temperature tuning, and dose tuning.

Figure 1C:
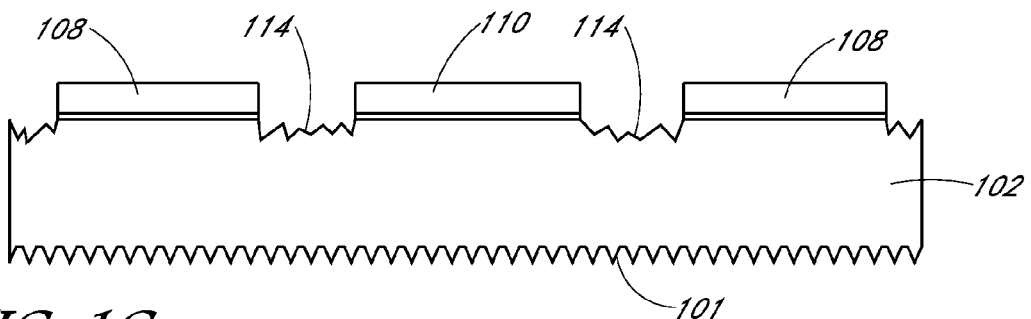

Referring to FIG. 1C and corresponding operation 208 of flowchart 200, the remaining non-implanted regions 112 of the amorphous silicon layer 106 are removed, for example with a selective etch process, preserving the first implanted regions 108 and the second implanted regions 110 of the amorphous silicon layer 106.

In an embodiment, the remaining non-implanted regions 112 of the amorphous silicon layer 106 are removed with a hydroxide-based wet etchant that further forms trenches 114 and/or texturizes exposed portions of the substrate 102. As such, in one embodiment, since the positioning of trenches 114 is determined by the first implanted regions 108 and the second implanted regions 110 of the amorphous silicon layer 106, the trenches 114 are formed self-aligned between the first implanted regions 108 and the second implanted regions 110 of the amorphous silicon layer 106, as is depicted in FIG. 3C.

It is to be appreciated that the timing of the texturizing of light receiving surface 101 and self-aligned trench 114 formation may vary. For example, in one embodiment, the texturizing of light receiving surface 101 is performed in a separate process preceding the formation/texturizing of trenches 114, as is represented in Figures IA-IC. However, in another embodiment, the texturizing of light receiving surface 101 is performed in a same process as the formation/texturizing of trenches 114. Furthermore, the timing of formation/texturizing of trenches 114 may vary relative to an anneal process used to crystallize the first implanted regions 108 and the second implanted regions 110. For example, in one embodiment, formation/texturizing of trenches 114 is performed in the process used to remove the remaining non-implanted regions 112 of the amorphous silicon layer 106, as is depicted in FIG. 1C. However, in another embodiment, formation/texturizing of trenches 114 is performed following removal of the remaining non-implanted regions 112 of the amorphous silicon layer 106 and subsequent anneal process. In an embodiment, a texturized surface may be one which has a regular or an irregular shaped surface for scattering incoming light, decreasing the amount of light reflected off of the light-receiving and/or exposed surfaces of the solar cell.

Figure 1D:
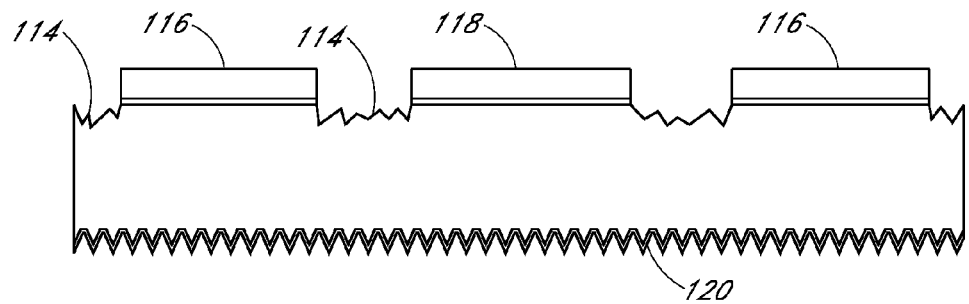

Referring to FIG. 1D and corresponding operation 210 of flowchart 200, the first implanted regions 108 and the second implanted regions 112 of the amorphous silicon layer 106 are annealed to form doped polycrystalline silicon emitter regions 116 and 118, respectively. In an embodiment, the annealing is performed at a temperature approximately in the range of 850-1100 degrees Celsius for a duration approximately in the range of 1-100 minutes. In an embodiment, a light phosphorous dopant drive is performed during the heating or annealing. Additional embodiments can include formation of a passivation or anti-reflective coating layer 120 on the light-receiving surface 101, as depicted in FIG. 1D.

It is to be appreciated that, while it may be generally most advantageous to complete the etch (i.e. removal) of non-implanted areas of amorphous silicon layer 106 prior to performing a high temperature anneal and activation process, as is described above, certain implant conditions may result in intrinsically higher reactivity in the texturizing etch (e.g., as relative to non-implanted regions). In such a case, a high temperature anneal can be performed prior to trench etch.

Figure 1E:
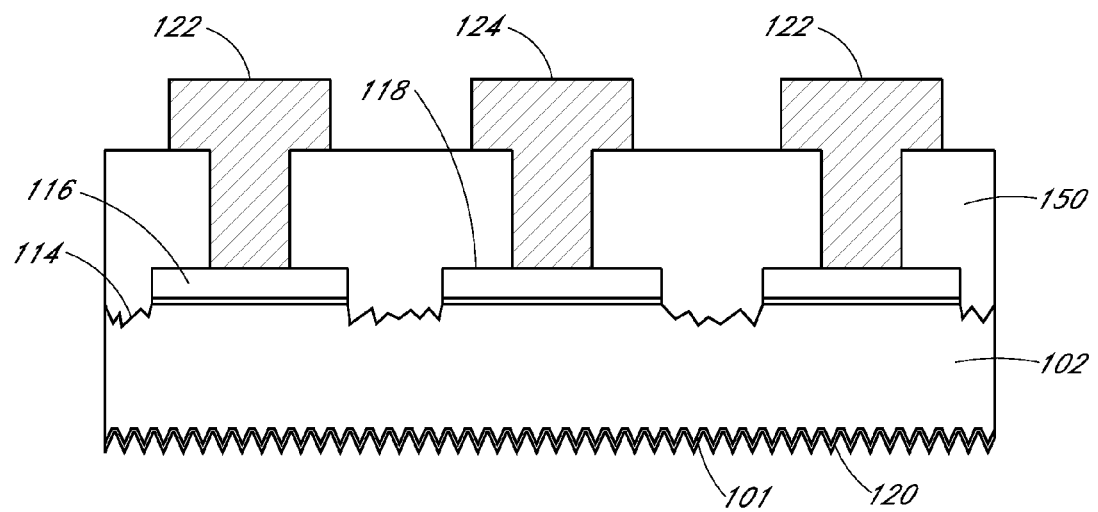

Referring to FIG. 1E, conductive contacts 122 and 124 are fabricated to contact the first 116 and second 118 doped polycrystalline silicon emitter regions, respectively. In an embodiment, the contacts are fabricated by first depositing and patterning an insulating layer 150 to have openings and then forming one or more conductive layers in the openings. In an embodiment, the conductive contacts 122 and 124 include metal and are formed by a deposition, lithographic, and etch approach or, alternatively, a printing process.

In a second exemplary process flow using implant induced etch selectivity for self-aligned trench formation, FIGS. 3A-3E illustrate cross-sectional views of various stages in the fabrication of a solar cell, in accordance with another embodiment of the present disclosure. FIG. 4 is a flowchart 400 listing operations in a method of fabricating a solar cell as corresponding to FIGS. 3A-3E, in accordance with an embodiment of the present disclosure.

Figure 3A:
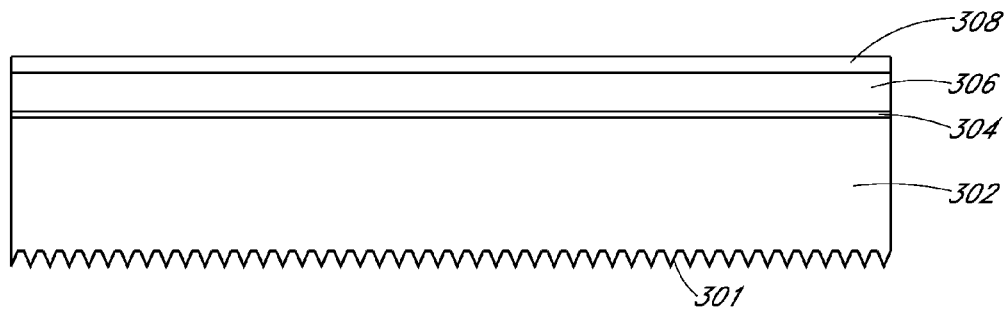
FIGS. 3A-3E illustrate cross-sectional views of various stages in the fabrication of a solar cell, in accordance with an embodiment of the present disclosure.
Figure 4:
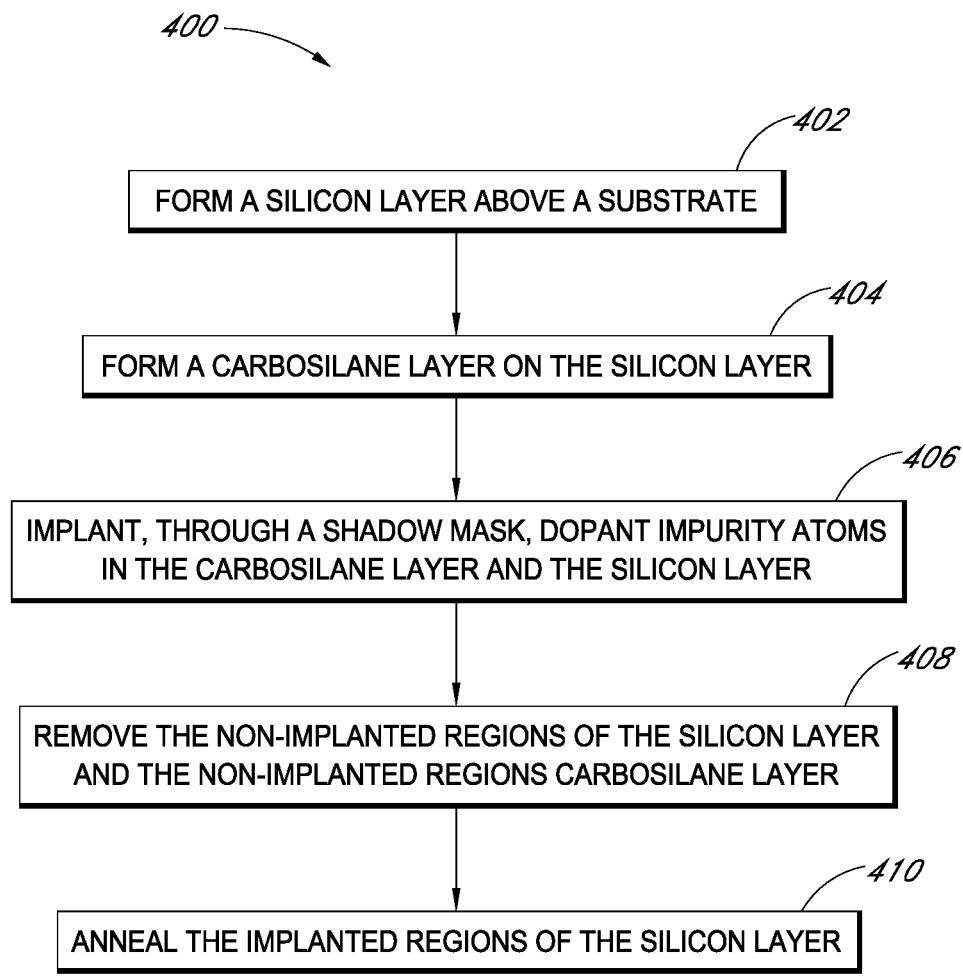
FIG. 4 is a flowchart listing operations in a method of fabricating a solar cell as corresponding to FIGS. 3A-3E, in accordance with an embodiment of the present disclosure.

Referring to FIG. 3A and corresponding operation 402 of flowchart 400, a method of fabricating alternating N-type and P-type emitter regions of a solar cell involves forming an amorphous silicon layer 306 on a thin dielectric layer 304 disposed on a substrate 302.

In an embodiment, the substrate 302 is a monocrystalline silicon substrate, such as a bulk single crystalline N-type doped silicon substrate. It is to be understood, however, that substrate 302 may be a layer, such as a multi-crystalline silicon layer, disposed on a global solar cell substrate. In an embodiment, the thin dielectric layer is a tunnel dielectric silicon oxide layer having a thickness of approximately 2 nanometers or less. In one embodiment, the amorphous silicon layer 306 is a hydrogenated silicon layer formed using plasma enhanced chemical vapor deposition (PECVD), represented by a-Si:H, which includes S—H covalent bonds throughout the layer. However, in an alternative embodiment, a polycrystalline silicon layer is used instead. Referring again to FIG. 3A, in an embodiment, a light receiving surface 301 of the substrate 302 is texturized, as shown and as described in greater detail below.

Referring again to FIG. 3A and now to corresponding operation 404 of flowchart 400, a carbosilane layer 308 is formed on the amorphous silicon layer 306. In an embodiment, the carbosilane layer 308 has a thickness approximately in the range of 50-1000 Angstroms. In an embodiment, the carbosilane layer 308 includes (e.g., as a primary component) an alternating Si—C—Si—C— type backbone with the majority of remaining bonds initially being to hydrogen (H). In one embodiment, the carbosilane layer 308 is deposited using a same apparatus employed to generate the underlying a-Si:H film, e.g., by plasma enhanced chemical vapor deposition (PECVD) using a suitable carbosilane precursor at relatively low temperature and RF power levels. In a specific such embodiment, the carbosilane layer 308 is deposited in a PECVD chamber at a temperature less than approximately 200 degrees Celsius and a bias of approximately 20 W at a frequency of approximately 13.56 MHz RF over a surface area sufficient to accommodate/process one solar cell. In an embodiment, a suitable precursor useful for forming the carbosilane layer 308 includes, but is not limited to, 1,3-disilapropane, 1,3disiabutane, 1,3,5-trisilapentane, or 1,3,5-trisilacyclohexane. In other embodiments, similar results may also be achieved by using alternative chemical routes for generating higher molecular weight polymeric carbosilane materials which exist as non-volatile but soluble solid polymers.

Figure 3B:
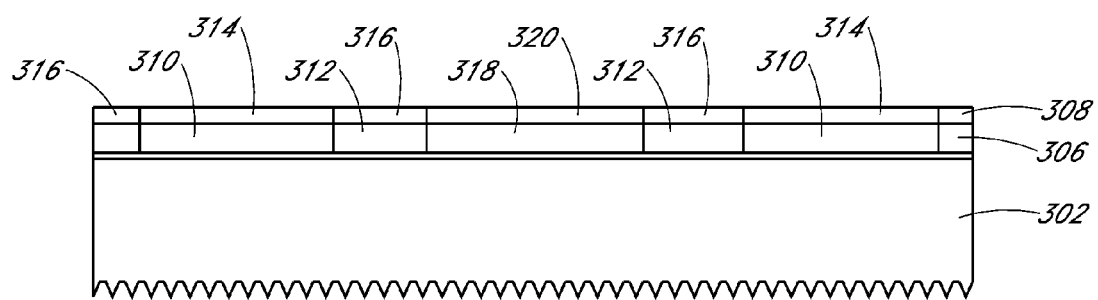
Figure 3C:
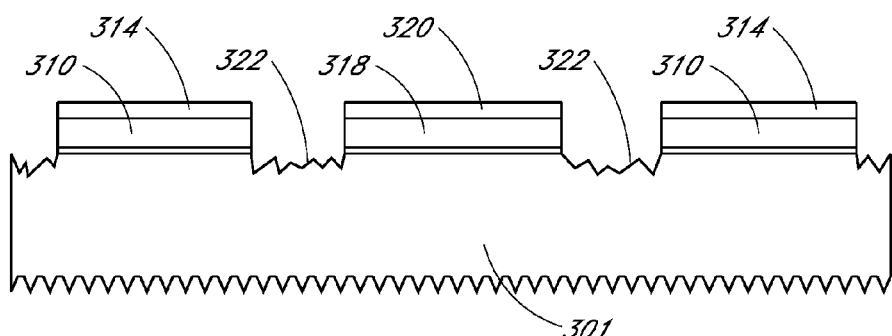

Referring to FIG. 3B and corresponding operation 404 of flowchart 400, dopant impurity atoms of a first conductivity type are implanted in the carbosilane layer 308 and in the amorphous silicon layer 306 to form first implanted regions 310 and resulting in non-implanted regions 312 of the silicon layer (i.e., remaining portions of amorphous silicon layer 306 that have not been implanted at this stage in the process). Additionally, the implanting forms corresponding first self-aligned implanted regions 314 of the carbosilane layer 308, and results in non-implanted regions 316 of the carbosilane layer 308. The first self-aligned implanted regions 314 of the carbosilane layer 308 are self-aligned with the first implanted regions 310 of the amorphous silicon layer since they are formed using a same mask and in a same implant process. In one such embodiment, the implanting is performed through a first shadow mask, examples of which are described in association with FIGS. 5B and 6B. In a specific such embodiment, the first shadow mask is a graphite shadow mask positioned off of, but in close proximity to, the carbosilane layer 308. The usable distance will be determined by the degree to which the ion beam can be collimated. A typical spacing would be between 50-250 microns which is roughly the same order of thickness as a Si solar wafer substrate. However, the spacing may be as high a 1000 microns (1 mm) under conditions which minimize the angle of divergence (from vertical) below the lower edge of the mask.

In an embodiment, the implanting is performed by using ion beam implantation or plasma immersion implantation. In one embodiment, this first implanting provides P+ dopant atoms for silicon (e.g., boron atoms). In another embodiment, however, the first implanting provides N+ dopant atoms for silicon (e.g., phosphorus atoms or arsenic atoms). In an embodiment, the conditions used to perform the implantation are tuned (e.g., by sequential or simultaneous electron bombardment) to enhance subsequent etch selectivity between implanted and non-implanted amorphous silicon regions, as pertaining to later operations described below. Other conditions that may be tuned can include one or more of substrate biasing during implantation, temperature tuning, and dose tuning.

Referring again to FIG. 3B and now to an additional round of corresponding operation 406 of flowchart 400, dopant impurity atoms of a second conductivity type are implanted in the carbosilane layer 308 and in the amorphous silicon layer 306 to form second implanted regions 318 and resulting in non-implanted regions 312 of the silicon layer (i.e., remaining portions of amorphous silicon layer 306 that were not been implanted in either of the above described implantation processes). Additionally, the implanting forms corresponding second self-aligned implanted regions 320 of the carbosilane layer 308, and results in remaining non-implanted regions 316 of the carbosilane layer 308. The second self-aligned implanted regions 320 of the carbosilane layer 308 are self-aligned with the second implanted regions 318 of the amorphous silicon layer 306 since they are formed using a same mask and in a same implant process. In one such embodiment, the implanting is performed through a second shadow mask, examples of which are described in association with FIGS. 5B and 6B. As in the case for the first shadow mask, in a specific such embodiment, the second shadow mask is a graphite shadow mask positioned off of, but in close proximity to, the carbosilane layer 308.

As in the case for the first implantation process, in an embodiment, the implanting is performed by using ion beam implantation or plasma immersion implantation. In one embodiment, this second implanting provides N+ dopant atoms for silicon (e.g., phosphorus atoms or arsenic atoms). In another embodiment, however, the second implanting provides P+ dopant atoms for silicon (e.g., boron atoms). In an embodiment, the conditions used to perform the implantation are tuned (e.g., by sequential or simultaneous electron bombardment) to enhance subsequent etch selectivity between implanted and non-implanted amorphous silicon regions, as pertaining to later operations described below. Other conditions that may be tuned can include one or more of substrate biasing during implantation, temperature tuning, and dose tuning.

Referring to FIG. 3C and corresponding operation 408 of flowchart 400, the remaining non-implanted regions 312 of the amorphous silicon layer 306 are removed with a selective etch process preserving the first implanted regions 310 and the second implanted regions 318 of the amorphous silicon layer 306. Additionally, the remaining non-implanted regions 316 of the carbosilane layer 308 are removed. In one embodiment, the implanted regions 314 and 320 of the carbosilane layer 308 protect the implanted regions 310 and 318, respectively, of the amorphous silicon layer 306 during the removing.

In an embodiment, the remaining non-implanted regions 312 of the amorphous silicon layer 306 and the remaining non-implanted regions 316 of the carbosilane layer 308 are removed with a hydroxide-based wet etchant that further forms trenches 322 and/or texturizes exposed portions of the substrate 302. As such, in one embodiment, trenches 322 are formed self-aligned between the first implanted regions 310 and the second implanted regions 318 of the amorphous silicon layer 306, as is depicted in FIG. 3C. In one embodiment, the hydroxide-based wet etchant treatment is followed by a hydrofluoric acid/ozone ($HF/O_3$) wet clean treatment.

It is to be appreciated that the timing of the texturizing of light receiving surface 301 and self-aligned trench 322 formation may vary. For example, in one embodiment, the texturizing of light receiving surface 301 is performed in a separate process preceding the formation/texturizing of trenches 322, as is represented in FIGS. 3A-3C. However, in another embodiment, the texturizing of light receiving surface 301 is performed in a same process as the formation/texturizing of trenches 322. Furthermore, the timing of formation/texturizing of trenches 322 may vary relative to an anneal process used to crystallize the first implanted regions 310 and the second implanted regions 318. For example, in one embodiment, formation/texturizing of trenches 322 is performed in the process used to remove the remaining non-implanted regions 312 of the amorphous silicon layer 306, as is depicted in FIG. 3C. However, in another embodiment, formation/texturizing of trenches 322 is performed following removal of the remaining non-implanted regions 322 of the amorphous silicon layer 306 and subsequent anneal process. In an embodiment, a texturized surface may be one which has a regular or an irregular shaped surface for scattering incoming light, decreasing the amount of light reflected off of the light-receiving and/or exposed surfaces of the solar cell.

Figure 3D:
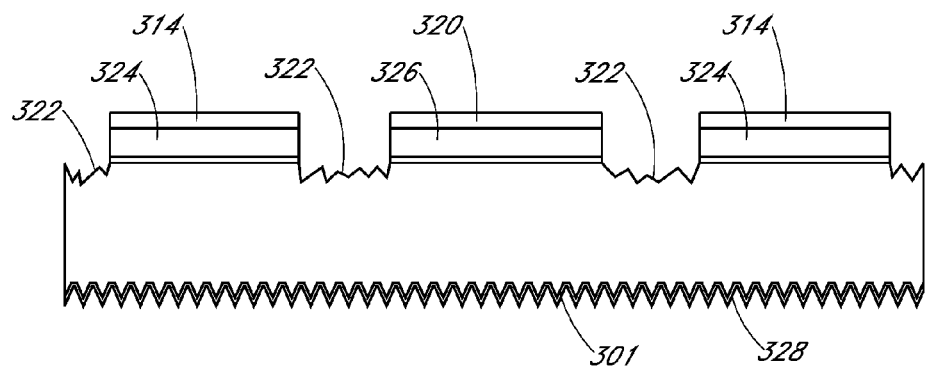

Referring to FIG. 3D and corresponding operation 410 of flowchart 400, the first implanted regions 310 and the second implanted regions 318 of the amorphous silicon layer 306 are annealed to form doped polycrystalline silicon emitter regions 324 and 326, respectively. In an embodiment, the annealing is performed at a temperature approximately in the range of 850-1100 degrees Celsius for a duration approximately in the range of 1-100 minutes. In an embodiment, a light phosphorus dopant drive is performed during the heating or annealing. Additional embodiments can include formation of a passivation or anti-reflective coating layer 328 on the light-receiving surface 301, as depicted in FIG. 3D.

In an embodiment, although not depicted as such FIG. 3D, subsequent to and/or during the removal of the remaining non-implanted portions 312 of the amorphous silicon layer 306, the implanted regions 314 and 320 of the carbosilane layer 308 can also be removed. In either case, the implanted regions 314 and 320 of the carbosilane layer 308 should be suitably less susceptible to the etch than the amorphous silicon layer 306 in order to provide at least a substantial amount of protection of the first implanted regions 310 and the second implanted regions 318 of the amorphous silicon layer 306 (e.g., without significantly eroding the implanted regions of the amorphous silicon layer 306). Alternatively, as is depicted in FIG. 3D, the implanted regions 314 and 320 of the carbosilane layer 308 can be retained through the annealing process. Following the anneal, the implanted regions 314 and 320 of the carbosilane layer 308 can be removed or can be retained, an embodiment of which is described below.

It is to be appreciated that, while it may be generally most advantageous to complete the etch (i.e. removal) of non-implanted areas of amorphous silicon layer 306 prior to performing a high temperature anneal and activation process, as is described above, certain implant conditions may result in intrinsically higher reactivity in the texturizing etch (e.g., as relative to non-implanted regions). In such a case, a high temperature anneal can be performed prior to trench etch.

Figure 3E:
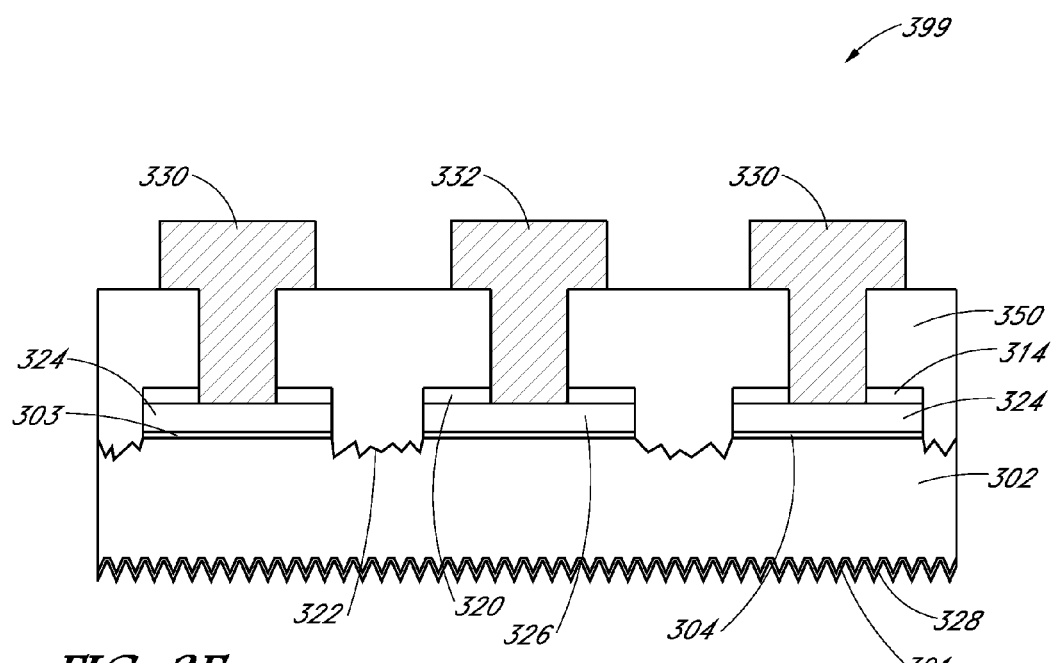

Referring to FIG. 3E, conductive contacts 330 and 332 are fabricated to contact the first 324 and second 326 doped polycrystalline silicon emitter regions, respectively. In an embodiment, the contacts are fabricated by first depositing and patterning an insulating layer 350 to have openings and then forming one or more conductive layers in the openings. In an embodiment, the conductive contacts 330 and 332 include metal and are formed by a deposition, lithographic, and etch approach or, alternatively, a printing process.

Referring again to FIG. 3E, in one embodiment, the implanted regions 314 and 320 of the carbosilane layer 308 (or at least remnants thereof) are retained in the final structure. In one such embodiment, the contacts 330 and 332 are formed through the implanted regions 314 and 320 of the carbosilane layer 308, e.g., by patterning the implanted regions 314 and 320 of the carbosilane layer 308 during the contact trench formation. Thus, in an embodiment, a back contact solar cell 399 includes a monocrystalline silicon substrate 302 having a light-receiving surface 301 and a back surface 303. A thin dielectric layer 304 is disposed on the back surface 303 of the monocrystalline silicon substrate 302. A polycrystalline silicon emitter region 324/326 is disposed on the thin dielectric layer 304. The polycrystalline silicon emitter region 324/326 is doped with impurity atoms. A carbosilane layer 314/320 is disposed on, and aligned with, the polycrystalline silicon emitter region 324/326. A conductive contact structure 330/332 is disposed through the carbosilane layer 314/320 and on the polycrystalline silicon emitter region 324/326. In one such embodiment, the carbosilane layer 314/320 is also doped with the impurity atoms.

Referring again to the approaches described in association with FIGS. 1A-1E and 3A-3E, in an embodiment, an Si—H rich a-Si:H layer is used as a source of both N+ and P+ implanted regions and/or an Si—H rich carbosilane-based film (e.g., a material incorporating substantial (—SiH$_2$—CH$_2$—SiH$_2$—CH$_2$—) character) is exposed to ion implant conditions in order to undergo crosslinking forming additional Si—C bonds. In either case, reactivity of a silicon-containing region is reduced with respect to etching in aqueous alkaline conditions useful for removing underlying amorphous, polycrystalline, or single crystalline silicon materials. In an embodiment, the conditions used to perform the ion implant steps may be tuned to enhance the etch selectivity between implanted and non-implanted regions (e.g., by sequential or simultaneous electron bombardment). In the case that carbosilane films are used, such films may be deposited using chemical vapor deposition techniques employing volatile carbosilane precursors.

Referring again to the approaches described in association with FIGS. 1A-1E and 3A-3E, in an embodiment a highly selective wet etchant can be employed to remove non-implanted material relative to implanted material (e.g., to remove non-implanted carbosilane selective to implanted carbosilane, or to remove non-implanted amorphous silicon selective to implanted amorphous silicon). However, in another embodiment, a patterned etchant material is used to the non-implanted areas. In one such embodiment, a screen printable silicon etch paste is disposed on non-implanted regions in order to direct an etching process toward the non-implanted regions.

In an embodiment, as described briefly above, a stationary graphite shadow mask may be used for implantation and, possibly, carbosilane deposition. As an example, FIG. 5A schematically illustrates a cross-sectional view of an inline platform for patterned implant involving traveling wafer and stationary shadow mask, in accordance with an embodiment of the present disclosure. FIG. 5B illustrates an implant sequence through graphite proximity masks in the apparatus of Figure 5A, in accordance with an embodiment of the present disclosure. Referring to FIG. 5A, an inline platform 500 includes a wafer input region 502, an implant source 504 (e.g., ion implantation or plasma immersion), and an output region 506. A stationary stencil mask 508, such as a stationary graphite mask, is held in proximity to, but not in contact with, a substrate 510 to provide an implanted substrate 512. Referring again to FIGS. 5A and 5B, it is to be appreciated that two consecutive implant sources (i.e., one for each dopant type) may be included on a same platform with two offset and registered graphite finger masks.

Figure 6A:
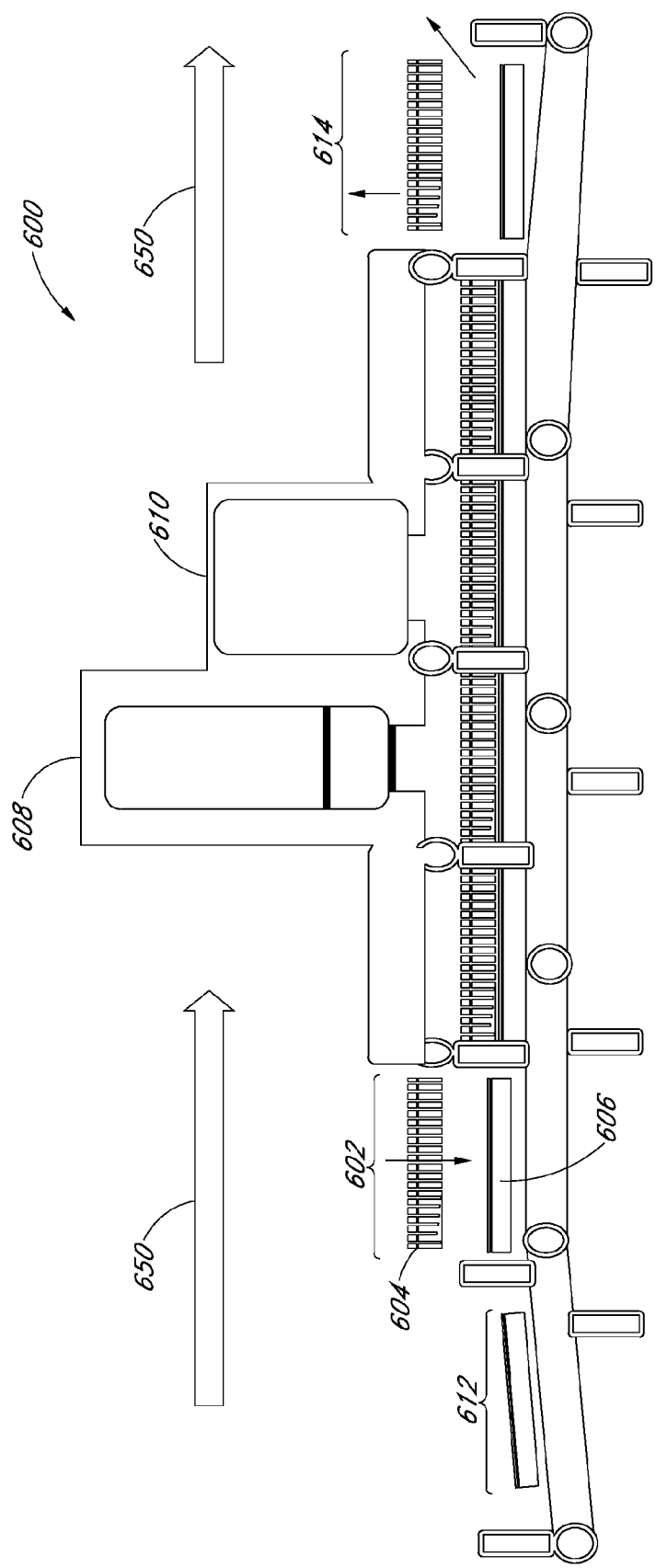
FIG. 6A schematically illustrates a cross-sectional view of an inline platform for patterned implant and capping, in accordance with an embodiment of the present disclosure.
Figure 6B:
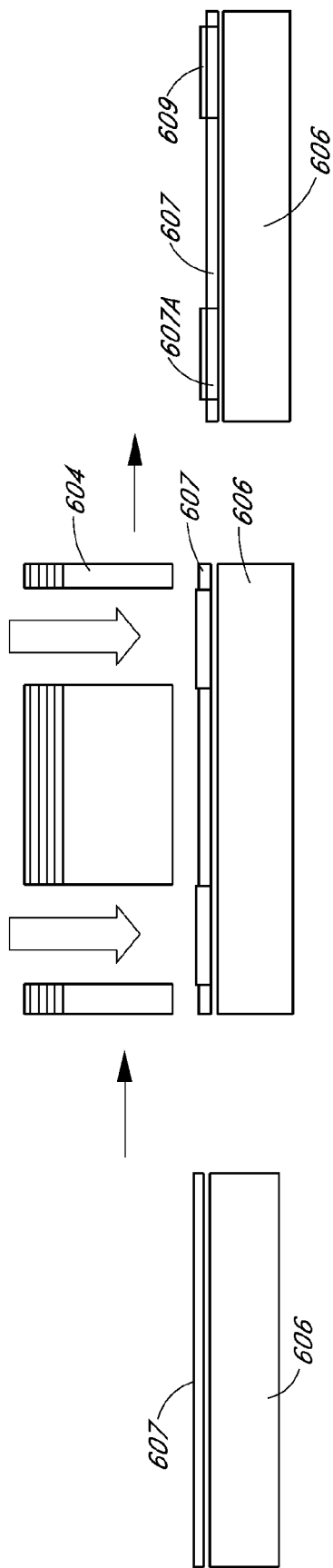
FIG. 6B illustrates an implant and capping sequence through silicon contact masks in the apparatus of FIG. 6A, in accordance with an embodiment of the present disclosure.

In another embodiment, a moveable silicon shadow mask may be used for implantation and, possibly, carbosilane deposition. As an example, FIG. 6A schematically illustrates a cross-sectional view of an inline platform for patterned implant and carbosilane deposition, in accordance with an embodiment of the present disclosure. FIG. 6B illustrates an implant and carbosilane deposition sequence through silicon contact masks in the apparatus of FIG. 6A, in accordance with an embodiment of the present disclosure.

Referring to FIG. 6A, an in-line process apparatus 600 for fabricating an emitter region of a solar cell includes a first station 602 for aligning a stencil mask 604 with a substrate 606. A second station 608 is included for implanting dopant impurity atoms (e.g., boron or phosphorus) above the substrate 606, through the stencil mask 604. A third station 610 is included for forming a carbosilane layer above the substrate 606, through the stencil mask 604. Other aspects of the in-line process apparatus 600 can include a wafer input area 612 and a mask removal and wafer output area 614.

In an embodiment, the stencil mask 604 and the substrate 606 are moved together at least through the second 608 and third 610 stations. The direction of wafer flow through the in-line process apparatus 600 is shown by arrows 650. Referring to FIG. 6B, in an embodiment, the in-line process apparatus 600 enables implant and carbosilane deposition on regions of a silicon layer 607 on the substrate 606 through the stencil mask 604. The implanted regions 607A and the carbosilane layer 609 are self-aligned since the carbosilane layer is formed using the same mask in the same position as is used to perform the implanting. In an embodiment, the first station 602 is for aligning the stencil mask 604 as in contact with on or in close proximity to the substrate 606. In an embodiment, the second station 608 includes an ion-implantation or plasma immersion implantation chamber. In an embodiment, the third station 610 includes a deposition chamber such as, but not limited to, a low pressure chemical vapor deposition (LPCVD), a plasma enhanced chemical vapor deposition (PECVD) chamber, a high density plasma chemical vapor deposition (HDPCVD) chamber, or a physical vapor deposition (PVD) chamber.

In either of the above described cases, in an embodiment, if carbosilane is deposited through mask, the carbosilane material may also be deposited on the stencil mask. After numerous runs of the stencil mask through the deposition environment, multiple carbosilane material layers may ultimately accumulate. It is to be appreciated that an optimal number of runs may be determined to balance throughput against an over-accumulation of material on the stencil mask that could in some way impact later deposition processes. In one such embodiment, after a certain number of runs, the accumulated carbosilane material is removed by selective etching, and the stencil mask can then be reused.

Overall, although certain materials are described specifically above, some materials may be readily substituted with others with other such embodiments remaining within the spirit and scope of embodiments of the present disclosure. For example, in an embodiment, a different material substrate, such as a group III-V material substrate, can be used instead of a silicon substrate. Furthermore, it is to be understood that, where N+ and P+ type doping is described specifically, other embodiments contemplated include the opposite conductivity type, e.g., P+ and N+ type doping, respectively.

In general, embodiments described herein may be implemented to provide lower cost, high throughput ion implant platforms for the fabrication of high efficiency interdigitated back contact (IBC)-type solar cells. Specific embodiments can offer an advantageous approach for generating self-aligned trenches among emitter regions formed by implantation. Embodiments may be particularly useful for the fabrication of solar cells that incorporate amorphous silicon (e.g., a-Si:H) derived emitters.

Thus, methods of fabricating solar cell emitter regions using ion implantation, have been disclosed.

In another aspect, established approaches for generating both n+ and p+ (Phosphorus and Boron doped) polysilicon emitter patterns typically rely on the patterning of silicon dioxide masking layers to define and isolate the underlying polysilicon emitter fingers. Aggressive alkali based Si etch chemistries are used to remove all unmasked polysilicon material to form a trench in place or defect rich p-n polysilicon junctions. In fact, currently used processes for trench isolation typically extend beyond the deposited polysilicon layer, through underlying thin dielectrics and into the underlying Si substrate. When performed in an isotropic batch process (with both sides of the wafer exposed to the same etch chemistry) it is particularly expedient to complete the etch sequence with conditions that create random pyramid texture over all exposed single crystalline Si surfaces, typically including the entire front surface and trench bottoms extending into the Si on the backside.

One or more additional embodiments described herein provides a simplified process flow for fabricating high efficiency, all back-contact solar cell devices involving the use of ion implant technology for generating one or both of N+ (e.g., typically phosphorous or arsenic doped) and P+ (e.g., typically boron doped) polysilicon emitter layers. In one embodiment, a fabrication approach involves the use of ion implantation to introduce atoms of the required dopant type as well as ancillary atoms into an emitter layer to induce sufficient changes in the wet etch properties of the emitter layer so as to permit its use as a mask during selective wet etch removal of all non-implanted regions of the emitter layer. One or more embodiments are directed to hardware and corresponding processes for integrated patterned ion implant and surface modification for high efficiency solar cell fabrication. One or more embodiments provide an effective, process operation saving approach for generating (and isolating) separate N- and P-doped polycrystalline silicon (polySi) finger emitters covering the backside of a high efficiency solar cell using patterned ion implant technology.

More particularly, it was discovered that Boron ion implantation of prototypical polysilicon/tunnel oxide stacks with a dose of at least 4E15 and energies between 5-15 KeV can automatically impart high resistance to alkaline Si etch chemistries, including conditions that completely remove all adjacent areas of non-implanted material. Unfortunately, no comparable selectivity appears possible using Phosphorus ion implants conditions useful for doping n+ emitter regions. As alternatives to already described approaches for implant induced etch resistance, viable schemes for protecting patterned P implanted regions include any means for applying very thin robust etch mask compositions exemplified by SiN or SiC. As already described above (and in connection with the patterned polycarbosilane masking layers mentioned herein), such patterns might be generated using any (ideally highly collimated) CVD or PVD based deposition method combined with a shadow mask, though any such process could be expected to suffer from pattern instability and particles with the buildup of depositing films over mask and chamber surfaces. In an embodiment, most easily implemented has been the conceptually cleaner process involving the shallow, lower energy (2 KeV) implant of Nitrogen ions at the surface of already P-implanted polysilicon. A dose offering reproducible resistance to alkaline KOH based Si etch is 8E15. Roughly equivalent performance was also observed for methane plasma based C ion implantation at performed at similar low energy but slightly higher dose. When implemented using a "traveling" graphite shadow mask "self-alignment" between P and N implant steps can be assured by allowing the wafer and mask to remain chucked together before a second pass under the same implant source reconfigured to run N. However, switching between plasma source chemistries leads to compromised performance and particles, with more manufacturable solutions likely to involve sequential implant steps as part of an inline process flow based on stationary shadow masks equilibrated under each ion beam source.

To provide further context, currently, interdigitated back contact (IBC) processing schemes can be implemented to effectively generate patterned diffusion regions covered by doped oxide layers. Such structures are patterned to generate texture etch resistant masks through which trench isolating N- and P-doped emitters are formed at the same time as front side texturizing is performed. While the concept of employing patterned ion implant to replace diffusion from patterned oxide layers may seem straightforward, unless combined with an approach providing self-aligned etch selectivity, such an approach may not be viable for fabricating a high efficiency solar cell structure having doped polycrystalline silicon emitter regions. This may particularly be the case for approaches using phosphorous implants.

Addressing one or more of the above issues, in accordance with an embodiment of the present disclosure, a one-dimensional finger structure for a solar cell ultimately having doped polycrystalline silicon emitter regions is formed by performing patterned ion implantation of phosphorous (or arsenic) and boron slightly offset from one another and leaving a non-implant gap in-between. Following the phosphorous (or arsenic) implant, a second self-aligned (e.g., through a same mask pattern) shallow implant of nitrogen, oxygen, or carbon ions (or positively charged molecular clusters containing these elements) is performed. The implantation of such ancillary (or "chaser") species in the same regions as the phosphorous (or arsenic) is performed in order to modify the surface of the implanted region and increase the etch resistance to alkaline texturing baths. Since boron implantation alone increases etch resistance substantially, a combination of first regions (e.g., implanted lines) of a polySi film having a phosphorous+ shallow chaser dopant profile interdigitated with second regions (e.g., implanted lines) of the polySi film having a boron dopant profile can be subjected to a well-established texture etch process flow. Such an etch process can simultaneously remove regions of non-implanted polySi (e.g., between implanted fingers) while texturing the front (sun-facing) side of the wafer. Furthermore, a new hardware platform is described that can perform all three patterned and aligned implant operations in a single pass. The above and other approaches and hardware platforms are described in greater detail below.

In an exemplary process flow using implant induced etch selectivity for self-aligned trench formation, FIGS. 7A-7G illustrate cross-sectional views of various stages in the fabrication of a solar cell, in accordance with an embodiment of the present disclosure. FIG. 8 is a flowchart 800 listing operations in a method of fabricating a solar cell as corresponding to FIGS. 7A-7G, in accordance with an embodiment of the present disclosure.

Figure 7A:
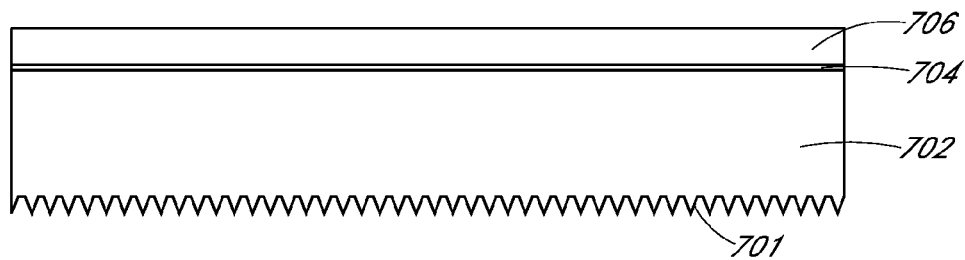
FIGS. 7A-7G illustrate cross-sectional views of various stages in the fabrication of a solar cell, in accordance with an embodiment of the present disclosure.
Figure 8:
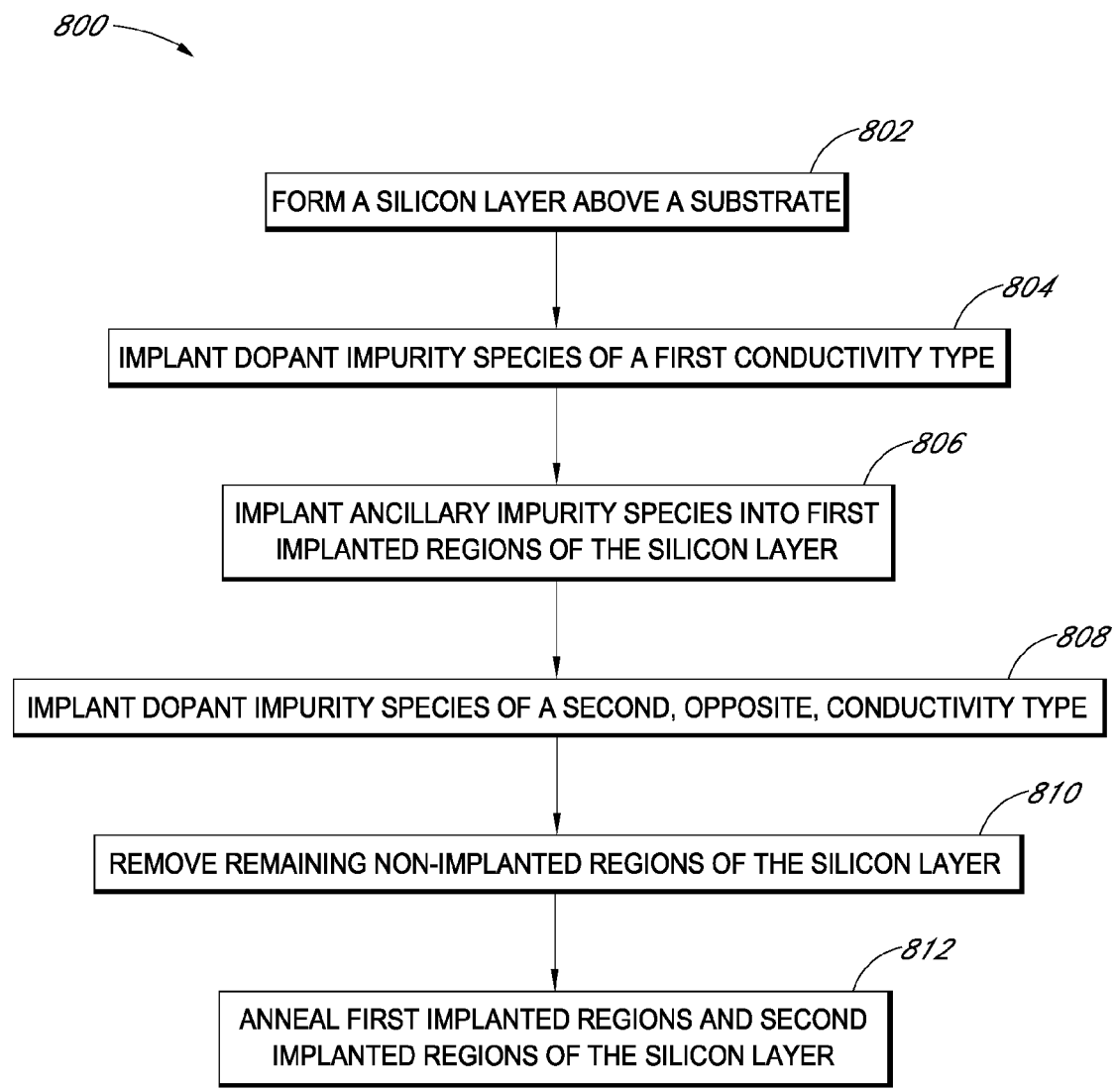
FIG. 8 is a flowchart listing operations in a method of fabricating a solar cell as corresponding to FIGS. 7A-7G, in accordance with an embodiment of the present disclosure.

Referring to FIG. 7A and corresponding operation 802 of flowchart 800, a method of fabricating alternating N-type and P-type emitter regions of a solar cell involves forming a silicon layer 706 on a thin dielectric layer 704 disposed on a substrate 702.

In an embodiment, the substrate 702 is a monocrystalline silicon substrate, such as a bulk single crystalline N-type doped silicon substrate. It is to be understood, however, that substrate 702 may be a layer, such as a multi-crystalline silicon layer, disposed on a global solar cell substrate. Referring again to FIG. 7A, in an embodiment, as shown, a light receiving surface 701 of the substrate 702 is texturized, as described in greater detail below. In an embodiment, the thin dielectric layer is a tunnel dielectric silicon oxide layer having a thickness of approximately 2 nanometers or less.

In an embodiment, the silicon layer 706 is an amorphous silicon layer. In one such embodiment, the amorphous silicon layer is formed using low pressure chemical vapor deposition (LPCVD) or plasma enhanced chemical vapor deposition (PECVD). However, in an alternative embodiment, a polycrystalline silicon layer is used instead of amorphous silicon.

Figure 7B:
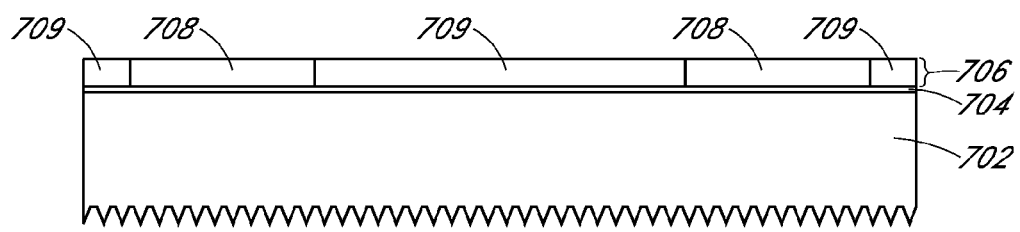

Referring to FIG. 7B and corresponding operation 804 of flowchart 800, dopant impurity species of a first conductivity type are implanted in the silicon layer 706 to form first implanted regions 708 and resulting in non-implanted regions 709 of the silicon layer (i.e., remaining portions of silicon layer 706 that have not been implanted at this stage in the process).

In an embodiment, the implanting is performed by using ion beam implantation or plasma immersion implantation. In one embodiment, this first implanting provides N+ dopant atoms for silicon (e.g., phosphorous or arsenic atoms). In a specific such embodiment, implanting the phosphorous or arsenic atoms or ions involves implanting to form a concentration of phosphorous or arsenic atoms in the silicon layer 706 approximately in the range of 1E19-1E20 atoms/cm$^3$.

Figure 10:
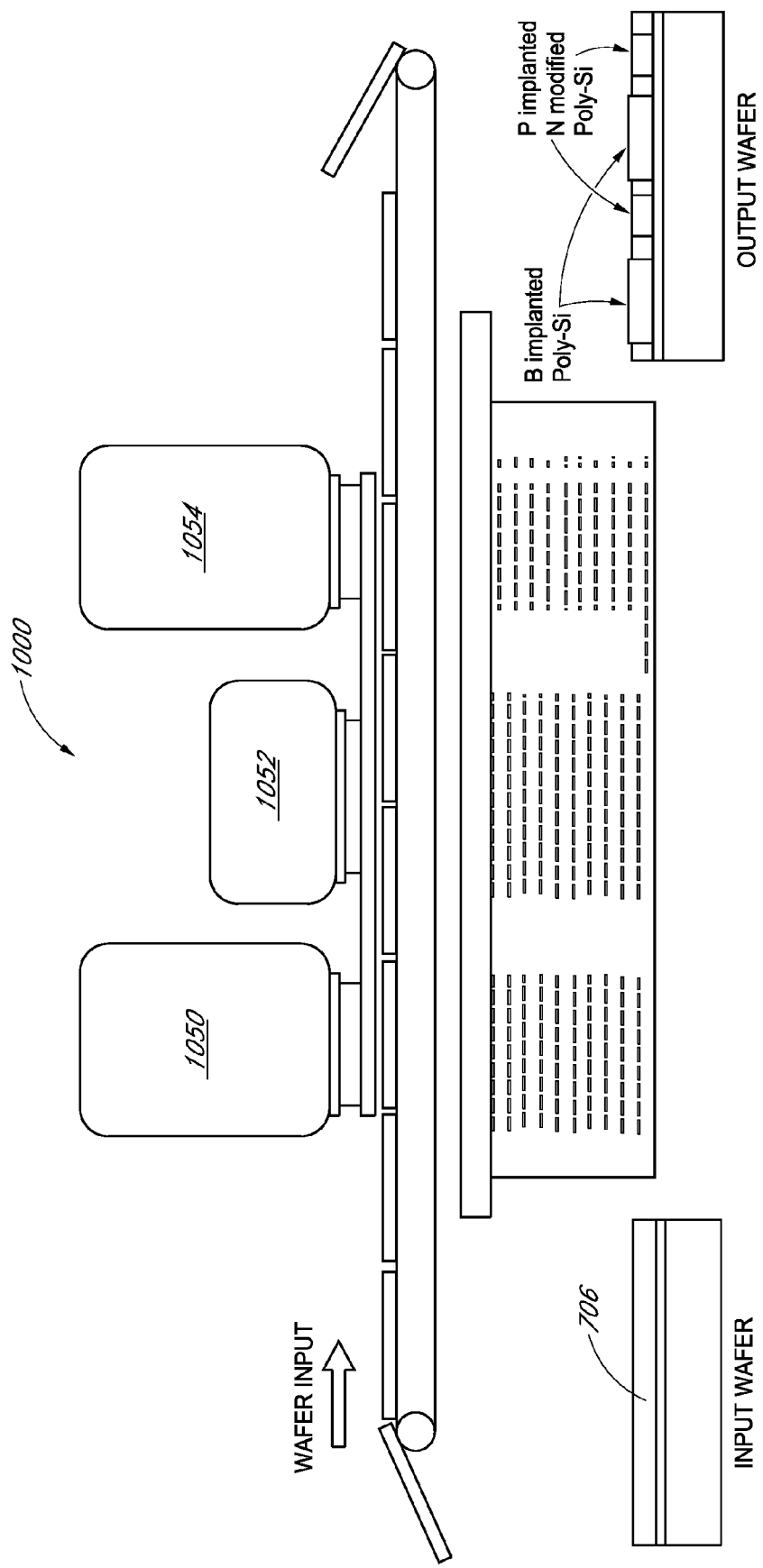
FIG. 10 schematically illustrates a cross-sectional view of an inline platform for patterned implant involving a traveling wafer and stationary shadow mask, in accordance with an embodiment of the present disclosure.

Referring again to operation 804, in an embodiment, the implanting is performed through a first shadow mask, an example of which is described in association with FIG. 10. In one such embodiment, the dopant impurity species of the first conductivity type are implanted through a first shadow mask having a first slit pattern. In an embodiment, the first shadow mask is a graphite shadow mask positioned off of, but in close proximity to, the silicon layer 706.

Figure 7C:
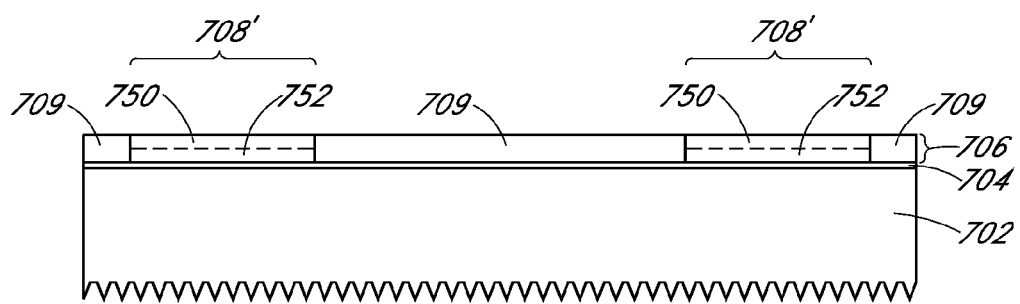

Referring next to FIG. 7C and corresponding operation 806 of flowchart 800, ancillary impurity species are implanted into the first implanted regions 708 of the silicon layer 706. The ancillary impurity species are different from the dopant impurity species of the first conductivity type. Additionally, in an embodiment, the corresponding region of the ancillary impurity species are implanted to have a depth in the silicon layer 706 less than the depth of the respective original first implanted region 708. As such, modified first implanted regions 708' are formed and, in one embodiment, have lower portions 752 that are phosphorous (or arsenic)-only regions 752 and have upper portions 750 that are regions of phosphorous (or arsenic) along with the ancillary impurity species, as is depicted in FIG. 7C.

In an embodiment, the ancillary impurity species implanted into the first implanted regions are species such as, but not limited to, nitrogen atoms or ions, carbon atoms or ions, or oxygen atoms or ions. It is to be appreciated that the term "ions" may include molecular ions containing one or more atoms of the dopant species bonded to additional hydrogen atoms. In one embodiment, the ancillary impurity species is nitrogen and is provided by implantation using $N_2$ or $NH_3$. In one embodiment, the ancillary impurity species is carbon and is provided by implantation using $CH_4$ or a hydrocarbon such as acetylene or, possibly, methylsilane. In one embodiment, the ancillary impurity species is oxygen and is provided by implantation using $N_2O$ or $O_2$.

In an embodiment, the implanting is performed by using ion beam implantation or plasma immersion implantation. In one embodiment, this second implanting ultimately provides nitrogen atoms, carbon atoms, or oxygen atoms in an upper portion of the N+ regions of the silicon layer 106. In a specific such embodiment, implanting the second implanting form a concentration of nitrogen, carbon or oxygen atoms in the silicon layer 106 approximately in the range of 1E19-1E21 atoms/cm$^3$. In one embodiment, the distribution of the ancillary impurity species is localized predominately within the first 1000 Angstroms below the surface of the silicon layer 106.

Referring again to operation 806, in an embodiment, the implanting is performed through a second shadow mask, an example of which is described in association with FIG. 10. In one such embodiment, the ancillary impurity species are implanted through a second shadow mask having the first slit pattern. The first slit pattern may be the same as or slightly modified from the above first slit pattern described in association with operation 804, as is described greater detail below. In an embodiment, the second shadow mask is a graphite shadow mask positioned off of, but in close proximity to, the silicon layer 706.

Figure 9:
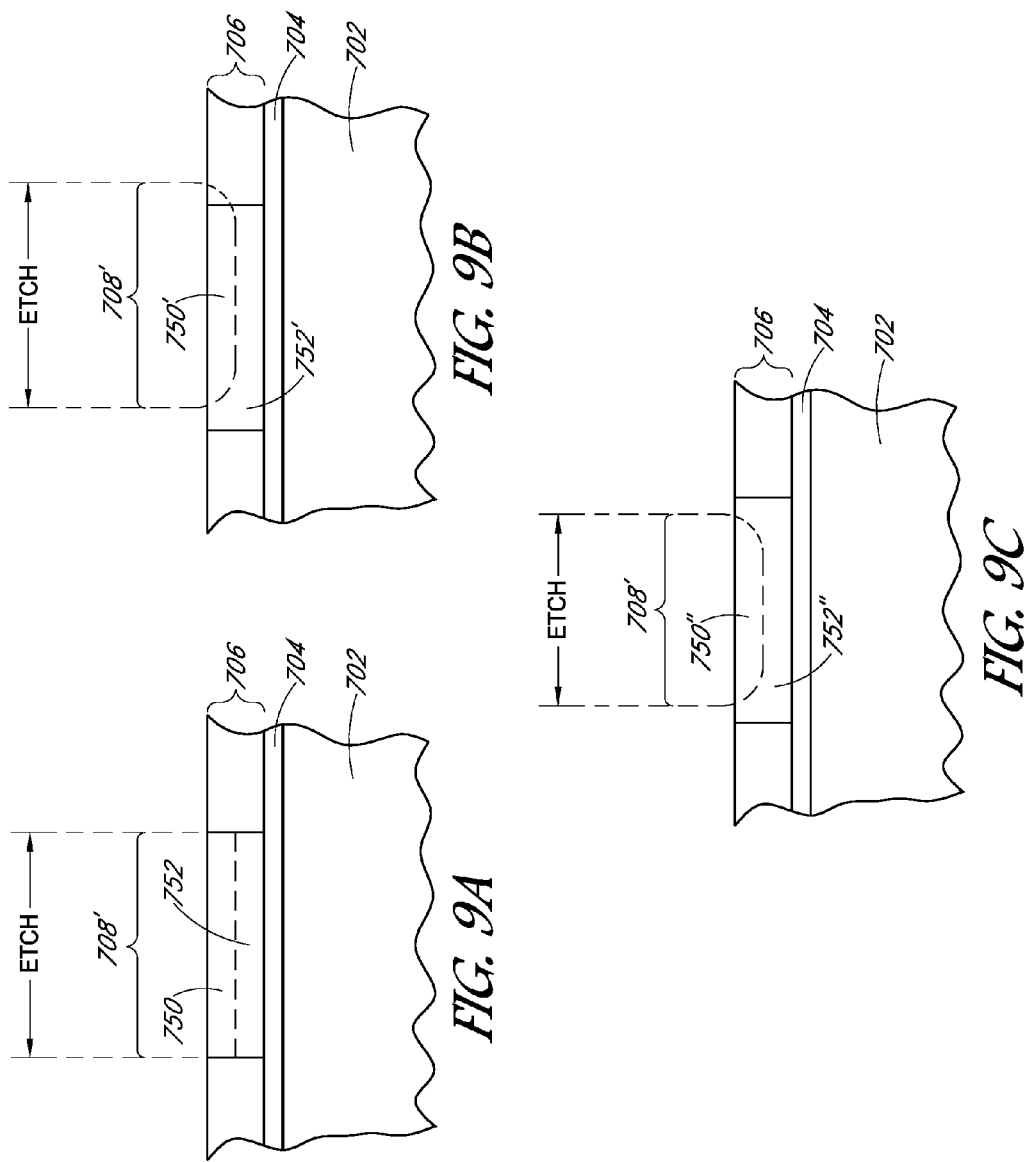
FIG. 9A illustrates a cross-sectional view of a modified first implanted region formed using an aligned slit pattern of same dimension, in accordance with an embodiment of the present disclosure.
FIG. 9B illustrates a cross-sectional view of a modified first implanted region formed using a misaligned slit pattern of same dimension, in accordance with an embodiment of the present disclosure.
FIG. 9C illustrates a cross-sectional view of a modified first implanted region formed using a slit pattern of smaller (e.g., narrower) dimension, in accordance with an embodiment of the present disclosure.

As mentioned above, implanting ancillary impurity species into the first implanted regions 708 can, in an embodiment, involve implanting through a second shadow mask having the first slit pattern (i.e., the slit pattern used to form original regions 708). In a first embodiment, the second shadow mask has the same slit pattern as the first slit pattern, and the dimensions of the slits are the same as those of the first shadow mask. As an example, FIG. 9A illustrates a cross-sectional view of a modified first implanted region 708' formed using an aligned slit pattern of same dimension. The region of ancillary atoms 750 is aligned with the N+ region 752 in the silicon layer 706.

However, FIG. 9B illustrates a cross-sectional view of a modified first implanted region 708' formed using a misaligned slit pattern of same dimension. The region of ancillary impurity species 750' is misaligned with the N+ region 752' in the silicon layer 706. That is, a portion of the region of ancillary impurity species 750' is formed within the N+ region 752', but a portion of the region of the ancillary impurity species 750' is formed outside of the N+ region 752'. It may be the case that is preferable to have the region of the ancillary impurity species formed entirely with the N+ region.

Accordingly, in one embodiment, FIG. 9C illustrates a cross-sectional view of a modified first implanted region 708' formed using a slit pattern of smaller (e.g., narrower) dimension. The region of ancillary impurity species 750" is narrower than and is formed entirely within the N+ region 752". In one such embodiment, using a narrower dimension for the slit in the second mask allows for misalignment tolerance without risk of having ancillary impurity species implanted outside of the N+ region.

Figure 7D:
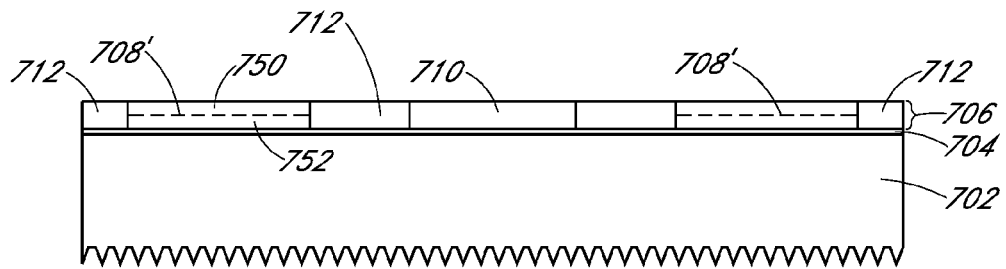

Referring to FIG. 7D and corresponding operation 808 of flowchart 800, dopant impurity species of a second conductivity type are implanted in the silicon layer 706 to form second implanted regions 710 and resulting in non-implanted regions 712 of the silicon layer (i.e., remaining portions of the silicon layer 706 that were not significantly implanted during any of the above described implantation processes).

As in the case for the first and second implantation processes, in an embodiment, the implanting is performed by using ion beam implantation or plasma immersion implantation. In one embodiment, this third implanting provides P+ dopant atoms for silicon (e.g., boron atoms). In a specific such embodiment, implanting the boron atoms or ions involves implanting to form a concentration of boron atoms in the silicon layer 706 approximately in the range of 1E19-1E20 atoms/cm$^3$.

Referring again to operation 808, in an embodiment, the implanting is performed through a third shadow mask, an example of which is described in association with FIG. 10. In one such embodiment, the dopant impurity species of the second conductivity type are implanted through a third shadow mask having a second slit pattern different from the first slit pattern. In one such embodiment, the first slit pattern and the second slit pattern together form a one-dimensional interdigitated finger pattern. As in the case of the first and second shadow masks, in an embodiment, the third shadow mask is a graphite shadow mask positioned off of, but in close proximity to, the silicon layer 706.

Figure 7E:
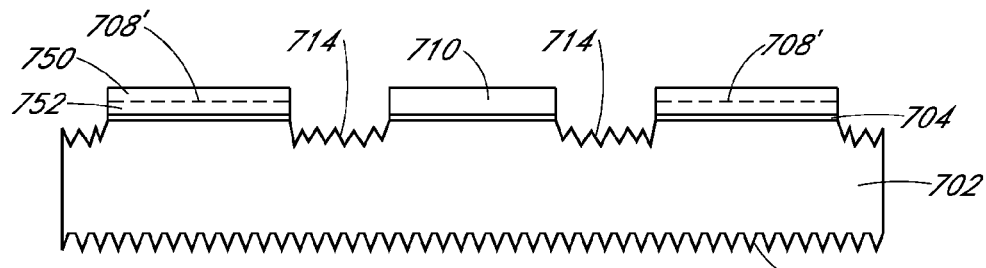

Referring to FIG. 7E and corresponding operation 810 of flowchart 800, the remaining non-implanted regions 712 of the silicon layer 706 are removed, for example with a selective etch process, preserving the modified first implanted regions 708' and the second implanted regions 710 of the silicon layer 706.

In embodiment, the ancillary impurity species provided in operation 806 to form the modified first implanted regions 708' inhibit the etching (e.g., slow the etch rate of) the modified first implanted regions 708'. In one such embodiment, the ancillary implanted species are employed to affect etch selectivity and are intentionally implanted at lower energies to achieve shallower distributions (e.g., near the surface). Furthermore, the amount of such ancillary species may be reduced or even completely eliminated in subsequent wet and/or dry etching/cleaning operations, particularly where the sole driving factor for including them is to inhibit etching of the N+ regions at operation 810.

Referring again to FIGS. 9A and 9C, in an embodiment, the corresponding region of the ancillary impurity species is entirely within the respective one of the original first implanted region 708. In a particular embodiment, referring only to FIG. 9C, the corresponding region of the ancillary impurity species has a width less than the width of the respective first implanted regions. In either case, in an embodiment, the resulting etch width is determined by the width of the region 750 or 750" of the ancillary impurity species, as is depicted in FIGS. 9A and 9C. In the case of FIG. 9C, then, in one embodiment, removing the remaining non-implanted regions of the silicon layer 706 further includes removing portions of the modified first implanted region 708' that does not include the corresponding region 750" of the ancillary impurity species. For comparison purposes, referring to FIG. 9B, such a resulting etch profile would include a region having ancillary impurity species formed outside of the N+ region. It is for this reason that use of an ancillary impurity species implantation mask having narrower dimensions of slits may be considered for the chaser implantation described above.

In an embodiment, the remaining non-implanted regions 712 of the silicon layer 706 are removed with a hydroxide-based wet etchant that further removes exposed portions of the thin dielectric layer 704 and forms trenches 714 into the substrate 702. The trenches may be formed to provide texturized portions of the substrate 702 as trench bottoms. In an embodiment, since the positioning of trenches 714 is determined by the first implanted regions 708' and the second implanted regions 710 of the silicon layer 706, the trenches 714 are formed as self-aligned between the first implanted regions 708' and the second implanted regions 710 of the silicon layer 706, as is depicted in FIG. 7E. In one embodiment, the hydroxide-based wet etchant treatment is followed by a hydrofluoric acid/ozone (HF/O$_3$) wet clean treatment.

It is to be appreciated that the timing of the texturizing of light receiving surface 701 and self-aligned trench 714 formation may vary. For example, in one embodiment, the texturizing of light receiving surface 701 is performed in a separate process preceding the formation/texturizing of trenches 714, as is represented in FIGS. 7A-7G. However, in another embodiment, the texturizing of light receiving surface 701 is performed in a same process as the formation/texturizing of trenches 714. Furthermore, the timing of formation/texturizing of trenches 714 may vary relative to an anneal process used to crystallize the first implanted regions 708' and the second implanted regions 710. For example, in one embodiment, formation/texturizing of trenches 714 is performed in the process used to remove the remaining non-implanted regions 712 of the silicon layer 706, as is depicted in FIG. 7E. However, in another embodiment, formation/texturizing of trenches 714 is performed following removal of the remaining non-implanted regions 712 of the silicon layer 706 and subsequent anneal process. In an embodiment, a texturized surface (whether in trench 714 or at surface 701) may be one which has a regular or an irregular shaped surface for scattering incoming light, decreasing the amount of light reflected off of the light-receiving and/or exposed surfaces of the solar cell.

Figure 7F:
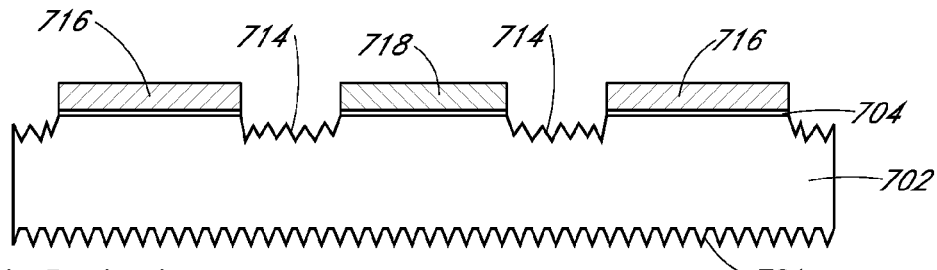

Referring to FIG. 7F and corresponding operation 812 of flowchart 800, the first implanted regions 708' and the second implanted regions 710 of the silicon layer 706 are annealed to form doped polycrystalline silicon emitter regions 716 and 718, respectively. In an embodiment, the annealing is performed at a temperature approximately in the range of 850-1100 degrees Celsius for a duration approximately in the range of 1-100 minutes. In an embodiment, a light phosphorous dopant drive is performed during the heating or annealing. Additional embodiments can include formation of a passivation or anti-reflective coating layer 720 on the light-receiving surface 701, an example of which is shown in FIG. 7G, described below.

It is to be appreciated that, while it may be generally most advantageous to complete the etch (i.e. removal) of non-implanted areas of silicon layer 706 prior to performing a high temperature anneal and activation process, as is described above, certain implant conditions may result in intrinsically higher reactivity in the texturizing etch (e.g., as relative to non-implanted regions). In such a case, a high temperature anneal can be performed prior to trench etch.

Figure 7G:
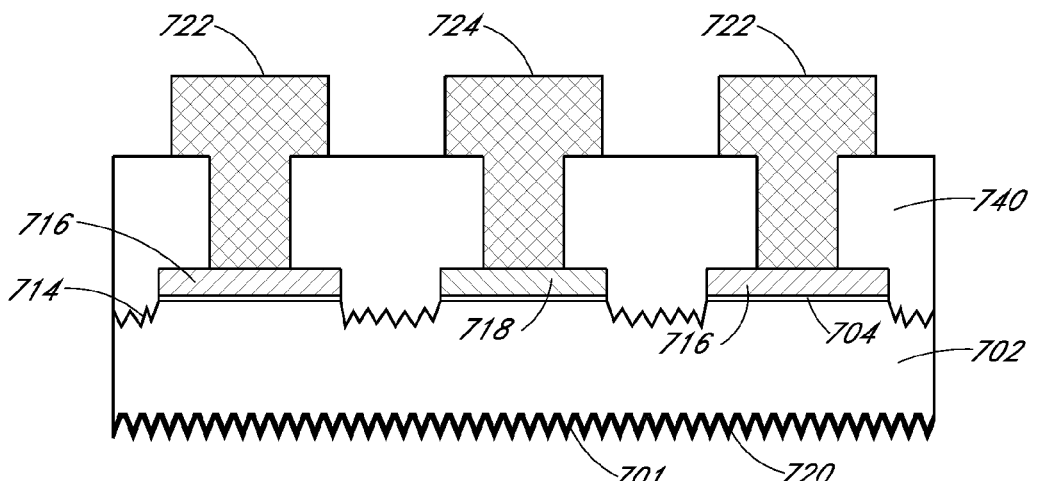

Referring to FIG. 7G, conductive contacts 722 and 724 are fabricated to contact the first 716 and second 718 doped polycrystalline silicon emitter regions, respectively. In an embodiment, the contacts are fabricated by first depositing and patterning an insulating layer 740 to have openings and then forming one or more conductive layers in the openings. In an embodiment, the conductive contacts 722 and 724 include metal and are formed by a deposition, lithographic, and etch approach or, alternatively, a printing process.

Referring again to FIG. 7G, then, in an exemplary embodiment, a back contact solar cell includes a crystalline silicon substrate 702 having a light-receiving surface 701 and a back surface. A first polycrystalline silicon emitter region 716 is disposed above the crystalline silicon substrate 702. The first polycrystalline silicon emitter region 716 is doped with dopant impurity species of a first conductivity type (e.g., phosphorous or arsenic atoms) and further includes ancillary impurity species (e.g., nitrogen atoms, carbon atoms, and/or oxygen atoms) different from the dopant impurity species of the first conductivity type. A second polycrystalline silicon emitter region 718 is disposed above the crystalline silicon substrate 702 and is adjacent to but separated from the first polycrystalline silicon emitter region 716. The second polycrystalline silicon emitter region 718 is doped with dopant impurity species of a second, opposite, conductivity type (e.g., boron atoms). First and second conductive contact structures 722 and 724 are electrically connected to the first and second polycrystalline silicon emitter regions 716 and 718, respectively.

In another aspect, FIG. 10 schematically illustrates a cross-sectional view of an inline platform for patterned implant involving a traveling wafer and stationary shadow mask, in accordance with an embodiment of the present disclosure.

Referring to FIG. 10, an inline platform 1000 includes a wafer input region for an input wafer having a layer of silicon 706. A first station 1050 is configured to implant dopant impurity atoms of a first conductivity type through a first shadow mask and into first regions of a material layer 706 disposed above a substrate. A second station 1052 is configured to implant ancillary impurity species through a second shadow mask and into the first regions of the material layer 706. A third station 1054 is configured to implant dopant impurity atoms of a second, different, conductivity type through a third shadow mask and into second, different, regions of the material layer 706. In a particular embodiment, as exemplified by the output wafer of FIG. 10, the first station 1050 is configured to implant phosphorous (or, alternatively, arsenic atoms) or ions, the third station 1054 is configured to implant boron atoms or ions, and the second station 1052 is configured to implant nitrogen atoms or ions (or, alternatively, carbon atoms or ions, or oxygen atoms or ions).

Referring again to FIG. 10, a stationary stencil mask 1002, such as a stationary graphite mask, is held in proximity to, but not in contact with, the substrate during implantation. Although shown as one mask with three corresponding slit patterns, it is to be appreciated that an individual shadow mask will typically be used for each of the modules 1050, 1052 and 1054. The usable distance for spacing from the receiving substrate may be determined by the degree to which the ion beam can be collimated. A typical spacing may be between 50-250 microns which is roughly the same order of thickness as a Si solar wafer substrate. However, the spacing may be as high a 1000 microns (1 mm) under conditions which minimize the angle of divergence (from vertical) below the lower edge of the shadow mask. In an embodiment, the resulting pattern of implanted regions is a one-dimensional interdigitated finger pattern.

In accordance with one or more embodiments, then, the combination of a patterned B ion implant with complementary P implant doping and shallow N ion surface modification (for etch resistance) has the potential to displace substantially much slower and less direct methodologies currently used to dope, pattern, and isolate polysilicon based n and p doped emitter structures. New platforms seeking to integrate and align two or more patterned ion implant steps into single high vacuum process sequences could facilitate extremely high throughput flows that could replace essentially every front end process between polysilicon deposition and texturizing/cleaning operations—including blanket deposition, patterning, and high temperature dopant diffusion steps and subsequent patterning of oxide masks for use in the trench isolation sequence. All of these might be circumvented using implant only based schemes capable of forming shallow masking layers by lower energy implantation of N or C near the surface. By permitting the selective Si etch of exposed non-implanted polysilicon films, process flows such as those described herein may enable simplified approaches for back contact solar cells based on polysilicon emitter regions that include a trench isolation feature critical for high efficiency n+ and p+ polysilicon emitter formation and isolation.

Thus, the introduction of new high throughput ion implant tools targeting high efficiency solar applications with patterning capabilities may be applicable to the fabrication of interdigitated back contact (IBC) solar cells. In particular, in cases where physical and chemical changes are associated with performing ion implant operations, such implantation can be exploited to permit the formation of a self-aligned trench pattern.

Overall, although certain materials are described specifically above, some materials may be readily substituted with others with other such embodiments remaining within the spirit and scope of embodiments of the present disclosure. For example, in an embodiment, a different material substrate, such as a group II-V material substrate, can be used instead of a silicon substrate. In another embodiment, a polycrystalline or multi-crystalline silicon substrate is used. Furthermore, it is to be understood that, where the ordering of N+ and then P+ type doping is described specifically for emitter regions on a back surface of a solar cell, other embodiments contemplated include the opposite ordering of conductivity type, e.g., P+ and then N+ type doping, respectively. Additionally, although reference is made significantly to back contact solar cell arrangements, it is to be appreciated that approaches described herein may have application to front contact solar cells as well. In general, embodiments described herein may be implemented to provide lower cost, high throughput ion implant platforms for the fabrication of high efficiency interdigitated back contact (IBC)-type solar cells. Specific embodiments can offer an advantageous approach for generating self-aligned trenches among emitter regions formed by implantation.

Thus, methods of fabricating solar cell emitter regions using ion implantation, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A back contact solar cell, comprising:
    a monocrystalline silicon substrate having a light-receiving surface and a back surface;
    a thin dielectric layer disposed on the back surface of the monocrystalline silicon substrate;
    a polycrystalline silicon emitter region disposed on the thin dielectric layer, the polycrystalline silicon emitter region doped with impurity atoms;
    a carbosilane layer disposed on, and aligned with, the polycrystalline silicon emitter region; and
    a conductive contact structure disposed through the carbosilane layer and on the polycrystalline silicon emitter region.

2. The back contact solar cell of claim 1, wherein the carbosilane layer is also doped with the impurity atoms.

3. The back contact solar cell of claim 1, wherein the polycrystalline silicon emitter region is hydrogenated.

4. The back contact solar cell of claim 1, further comprising texturized portions of the substrate adjacent to the polycrystalline silicon emitter region.

5. The back contact solar cell of claim 1, wherein the impurity atoms are boron atoms.

6. The back contact solar cell of claim 1, wherein the impurity atoms are phosphorous atoms.

7. A solar cell, comprising:
    a thin dielectric layer disposed on a surface of a substrate;
    a silicon layer disposed on the thin dielectric layer, the silicon layer doped with impurity atoms;
    a carbon carbosilane layer disposed on the silicon layer, the carbon carbosilane layer aligned with and separate and distinct from the silicon layer; and
    a conductive contact structure disposed through the carbon carbosilane layer and on the silicon layer.

8. The solar cell of claim 7, wherein the carbon carbosilane layer is also doped with the impurity atoms.

9. The solar cell of claim 7, wherein the silicon layer is hydrogenated.

10. The solar cell of claim 7, further comprising texturized portions of the substrate.

11. The solar cell of claim 7, wherein the impurity atoms are boron atoms or phosphorous atoms.

* * * * *